(12) United States Patent
Numata et al.

(10) Patent No.: US 8,438,709 B2
(45) Date of Patent: May 14, 2013

(54) METHOD OF FABRICATING A PIEZOELECTRIC VIBRATOR

(75) Inventors: Masashi Numata, Chiba (JP); Yasuo Kawada, Chiba (JP); Sadao Oku, Chiba (JP)

(73) Assignee: Seiko Instruments Inc., Chiba (JP)

( * ) Notice: Subject to any disclaimer, the term of this patent is extended or adjusted under 35 U.S.C. 154(b) by 840 days.

(21) Appl. No.: 12/372,179

(22) Filed: Feb. 17, 2009

(65) Prior Publication Data

US 2009/0144956 A1    Jun. 11, 2009

Related U.S. Application Data

(62) Division of application No. 11/947,553, filed on Nov. 29, 2007, now Pat. No. 7,511,405.

(30) Foreign Application Priority Data

Nov. 30, 2006  (JP) ................. 2006-324113
Nov. 30, 2006  (JP) ................. 2006-324183
Oct. 4, 2007    (JP) ................. 2007-260565

(51) Int. Cl.
  *H04R 17/10*    (2006.01)
  *H01R 43/20*    (2006.01)
(52) U.S. Cl.
  USPC ................. 29/25.35; 29/854; 29/860
(58) Field of Classification Search ......... 29/25.35, 29/594, 842, 857, 854, 860; 310/340, 344, 310/348, 351–353
See application file for complete search history.

(56) References Cited

U.S. PATENT DOCUMENTS

| 5,392,006 A | 2/1995 | Ikeda et al. |
| 5,504,460 A * | 4/1996 | Ikeda et al. ............. 29/25.35 X |
| 5,773,914 A | 6/1998 | Gottier |
| 6,571,443 B2 * | 6/2003 | Lally et al. ................. 29/860 X |
| 6,924,582 B2 | 8/2005 | Shimizu et al. |
| 7,397,171 B2 | 7/2008 | Uetake et al. |
| 2006/0176128 A1 | 8/2006 | Matsuyama et al. |

FOREIGN PATENT DOCUMENTS

| GB | 2 002 955 A | 2/1979 |
| JP | 54-082190 A | 6/1979 |
| JP | 57-097213 A | 6/1982 |
| JP | 60-041313 A | 3/1985 |
| JP | 64-000809 A | 1/1989 |
| JP | 03087078 A * | 4/1991 .................. 29/25.35 |
| JP | 2002-43886 A | 2/2002 |
| JP | 2006-262443 A | 9/2006 |

\* cited by examiner

*Primary Examiner* — A. Dexter Tugbang
(74) *Attorney, Agent, or Firm* — Brinks Hofer Gilson & Lione

(57) ABSTRACT

A method for fabricating a piezoelectric vibrator includes inserting a filling member formed with a through hole inside of a ring having a substantially cylindrical shape, and inserting one piece of a lead to the through hole of the filling member to project from both sides of the ring. The method further includes sintering the filling member along with the ring and the lead to integrate in an airtight manner, subjecting an exciting electrode of the piezoelectric vibrating piece to a bump connection with an inner lead portion of the lead projected from the ring, subjecting another exciting electrode on a side of the piezoelectric vibrating piece opposed to the other exciting electrode to wire bonding with the ring, and press-fitting the ring to an opening portion of a case and sealing the piezoelectric vibrating piece connected with the inner lead portion inside of the case in an airtight manner.

12 Claims, 35 Drawing Sheets

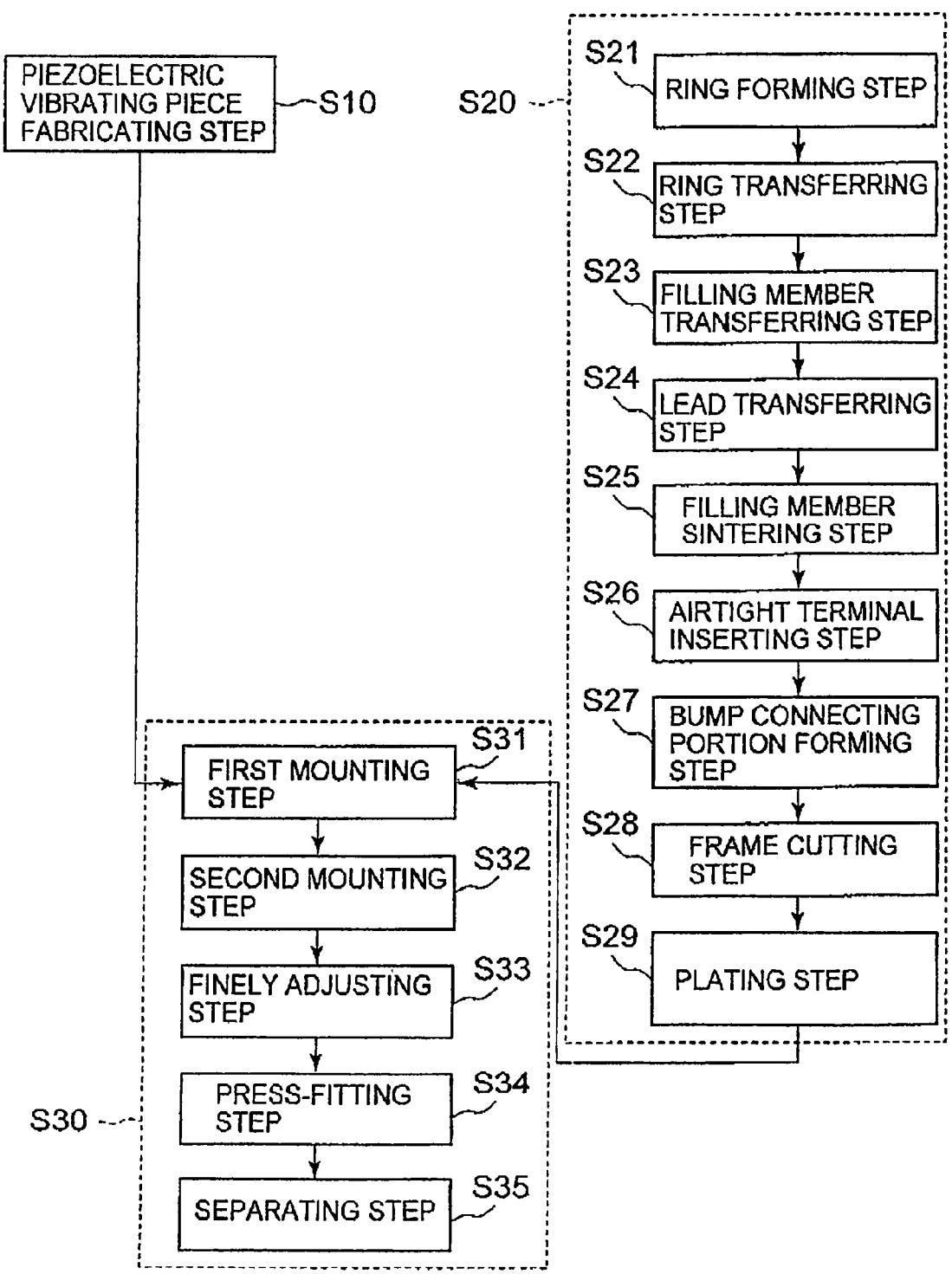

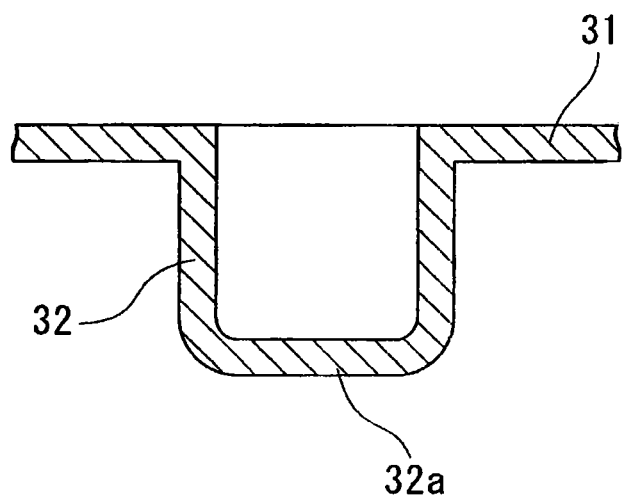
FIG. 6A
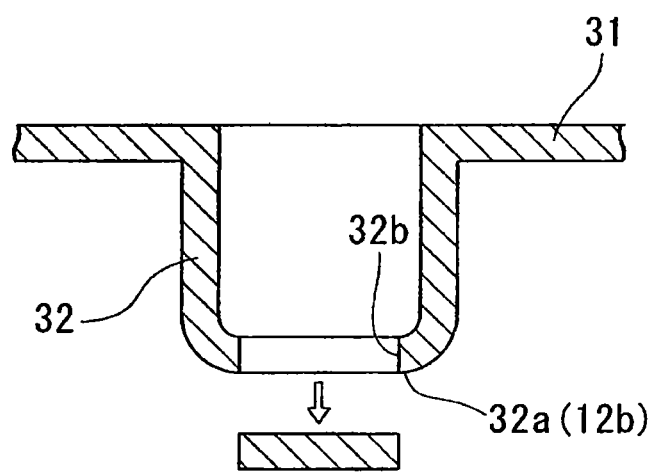
FIG. 6B
FIG. 6C
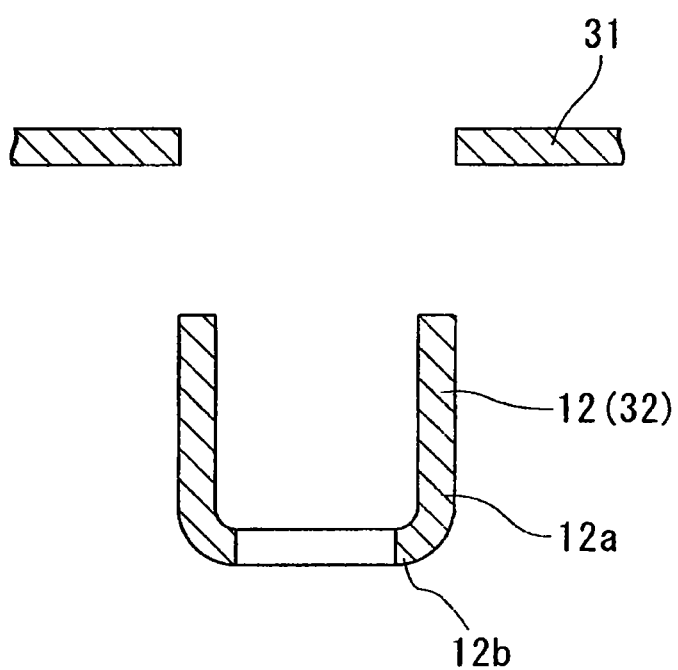

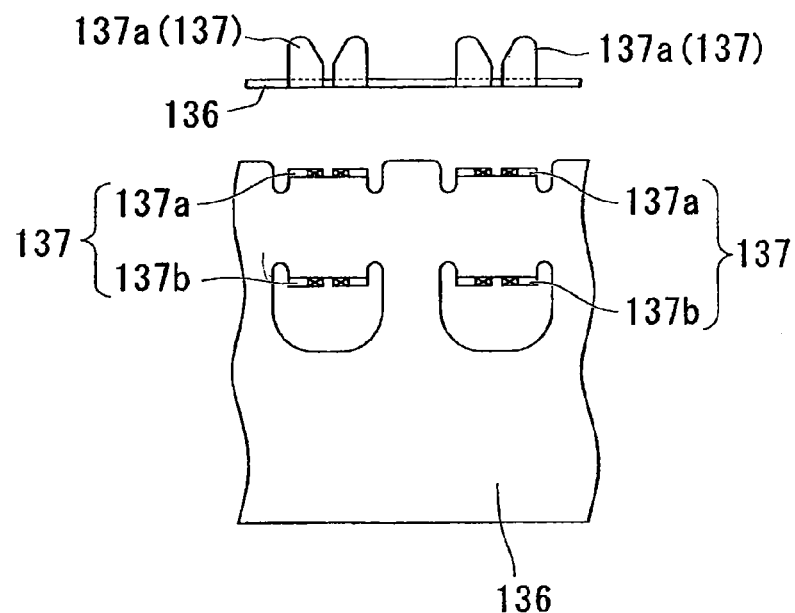
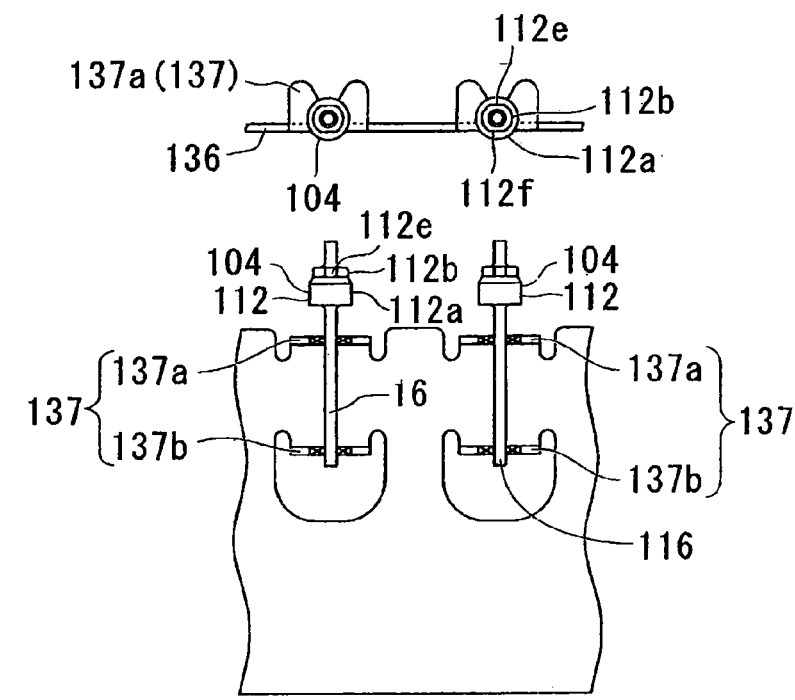

# METHOD OF FABRICATING A PIEZOELECTRIC VIBRATOR

REFERENCE TO THE RELATED APPLICATIONS

This application is a divisional application of U.S. application Ser. No. 11/947,553 filed Nov. 29, 2007, now U.S. Pat. No. 7,511,405, which claims priority to Japanese Patent Application Nos. JP2006-324113 filed Nov. 30, 2006, JP2006-324183 filed Nov. 30, 2006, and JP2007-260565 filed Oct. 4, 2007, the contents of which are hereby incorporated by references entirely.

FIELD OF THE INVENTION

The present invention relates to a piezoelectric vibrator and a method of fabricating a piezoelectric vibrator, as well as an oscillator, an electronic apparatus, and a radio wave timepiece having a piezoelectric vibrator.

DESCRIPTION OF THE RELATED ART

In recent years, a piezoelectric vibrator utilizing quartz or the like is used in a portable telephone or a portable information terminal as a time source or a timing source of a control signal, a reference signal source or the like. Although various piezoelectric vibrators of this kind are provided, as one thereof, a piezoelectric vibrator of a cylinder package type formed substantially in a cylindrical shape is known.

According to the piezoelectric vibrator of the cylinder package type, respectives of exciting electrodes provided at both faces of a piezoelectric vibrating piece are made to be able to be connected to outside by projecting 2 pieces of leads from a side of an opening portion of a case for sealing the piezoelectric vibrating piece in airtight. A sectional dimension of the piezoelectric vibrator after having been molded by a resin is generally about 1.2 mm through 3.0 mm in a side thereof and in recent years, further small-sized formation has been requested. Here, in order to achieve the small-sized formation, it is necessary to reduce an outer diameter of the case at inside of the resin mold, and therefore, also an interval between 2 pieces of the leads inserted from the opening portion to inside of the case is narrowed, thereby, there is a concern that an interval between the lead and a ring cannot firmly be insulated by a filling member, or the leads are shortcircuited. Therefore, there is proposed a piezoelectric vibrator in which whereas one of exciting electrodes of a piezoelectric vibrating piece is made to be able to be connected to outside by projecting 1 piece of 2 pieces of leads from an opening portion of a case, a ring press-fitted to the opening portion of the case and the case are constituted by conductive members, and other of the exciting electrodes is made to be able to be connected to outside by way of the case in place of the lead (refer to, for example, JP-A-2002-43886). Further in details, at inside of the case, an end portion of the ring is formed with a projected piece which is projected to an inner side and a front end portion of which is extended in a direction of extending the lead. Further, respectives of the exciting electrodes are made to be able to be connected to outside by way of the lead and the ring by bonding the corresponding exciting electrodes to respectives of the lead and the projected piece of the ring by a conductive adhering agent, thereby, further small-sized formation can be achieved by preventing shortcircuit.

However, according to the piezoelectric vibrator of JP-A-2002-43886, it is necessary to form the projected piece having a complicated shape projected to the inner side and extended in the direction of extending the lead at the end portion of the ring in order to be adhered to the conductive adhering agent. Therefore, it is difficult to form the projected piece along with an outer shape of the ring by pressing, as a result, the small-sized formation has not been achieved.

SUMMARY OF THE INVENTION

The invention has been carried out in view of the above-described situation and it is an object thereof to provide a piezoelectric vibrator and its fabricating method capable of achieving small-sized formation while preventing exciting electrodes provided at both faces of a piezoelectric electric vibrating piece from being shortcircuited with each other and capable of being fabricated easily as well as an oscillator, an electronic apparatus, and a radio wave timepiece having a piezoelectric vibrator.

In order to resolve the above-described problem, the invention proposes the following means.

A piezoelectric vibrator of the invention comprises a case constituted by a shape of a bottomed cylinder having an opening portion and having a conductivity, a ring substantially constituted by a shape of a cylinder press-fitted to the opening portion of the case and having a conductivity, one piece of a lead inserted to the ring and having an inner lead portion projected to inside of the case and an outer lead portion projected to outside of the case, a filling member having an insulating property for sealing an interval between the lead and the ring in airtight, and a piezoelectric vibrating piece which is substantially constituted by a shape of a plate arranged at inside of the case and includes exciting electrodes respectively at both faces thereof and in which one of the exciting electrodes is supported by the inner lead portion by being subjected to bump connection to the inner lead portion of the lead and other of the exciting electrodes on a side opposed to one of the exciting electrodes is subjected to wire bonding with the ring.

Further, the invention is a method of fabricating a piezoelectric vibrator in which a piezoelectric vibrating piece substantially constituted by a shape of a plate and including exciting electrodes respectively at both faces thereof at inside of a case constituted by a shape of a bottomed cylinder an opening portion of which is sealed in airtight, the method comprising, a filling member transferring step of inserting a filling member formed with a through hole and having an insulating property to inside of a ring substantially constituted by a shape of a cylinder having a conductivity, a lead transferring step of inserting one piece of a lead to the through hole of the filling member inserted to inside of the ring to project from both sides thereof, a filling member sintering step of sintering the filling member along with the ring and the lead to integrate in airtight, a first mounting step of subjecting one of the exciting electrodes of the piezoelectric vibrating piece to bump connection with an inner lead portion of the lead projected from the ring, a second mounting step of subjecting other of the exciting electrodes on a side opposed to the one of the exciting electrodes of the piezoelectric vibrating piece connected to the inner lead portion to wire bonding with the ring, and a press-fitting step of press-fitting the ring to the opening portion of the case having a conductivity and sealing the piezoelectric vibrating piece connected with the inner lead portion to inside of the case in airtight.

According to the piezoelectric vibrator and the method of fabricating the piezoelectric vibrator according to the invention, the ring, the filling member and the lead can be integrated by the filling member transferring step, the lead transferring step, and the filling member sintering step. Further, by subjecting the one of the exciting electrodes of the piezoelectric vibrating piece to bump connection with the inner lead portion of the lead in the first mounting step, the one of the exciting electrodes and the lead are brought into a conducted state and the piezoelectric vibrating piece is brought into a state of being supported by the inner lead portion of the lead. Under the state, whereas by subjecting the other of the exciting electrode and the ring to wire bonding at the second mounting step, the other of the exciting electrodes is brought into a state of being conducted to the ring, the lead and the one of the exciting electrodes can be brought into an insulated state by the filling member.

Further, when the ring is press-fitted to the opening portion of the case having the conductivity in the press-fitting step, the piezoelectric vibrating piece is sealed to inside of the case in airtight, the one of the exciting electrodes is brought into a state of being electrically connected to the lead, and the other of the exciting electrodes is brought into a state of being electrically connected to the case by way of the ring. Here, in connecting the other of the exciting electrodes and the ring by wire bonding, only a bonding wire is arranged therebetween, and therefore, it is not necessary to enlarge outer diameters of the case and the ring. Further, an end portion of the bonding wire is only bonded to the ring, and therefore, the ring needs not to be constituted by a complicated shape and can easily be formed by pressing even when the outer diameter is reduced.

Further, in the above-described piezoelectric vibrator, it is preferable that a portion of the inner lead portion of the lead is provided with a bump connection portion formed substantially by a flat face and connected with the one of the vibrating electrodes of the piezoelectric vibrating piece.

Further, in the method of fabricating a piezoelectric vibrator, it is preferable that the method further comprises a bump connecting portion forming step of forming a bump connecting portion substantially constituted by a flat face by pressing to crush a portion of the inner lead portion of the lead, wherein in the first mounting step, the one of the exciting electrodes of the piezoelectric vibrating piece is subjected to bump connection with the bump connecting portion.

According to the piezoelectric vibrator and the method of fabricating the piezoelectric vibrator according to the invention, by subjecting the one of the exciting electrodes to bump connection with the bump connecting portion substantially formed by the flat face by the bump connecting portion forming step and the first mounting step, the one of the exciting electrodes and the lead can be conducted and the piezoelectric vibrating piece can be brought into a state of being supported by the lead further firmly. Further, by forming the bump connecting portion substantially by the flat face by pressing to crush a portion of the inner lead portion, the lead and the piezoelectric vibrating piece can be arranged at positions substantially equal to the center axis of the case and the ring, and the case and the ring can further be downsized.

Further, according to the method of fabricating a piezoelectric vibrator, it is preferable that the bump connecting portion forming step is carried out after the filling member sintering step.

According to the method of fabricating a piezoelectric vibrator according to the invention, by carrying out the bump connecting portion forming step after the filling member sintering step, it is not necessary to adjust directions of the ring and the bump connecting portion of the lead relative to each other in the lead transferring step and the filling member sintering step. Further, when the bump connecting portion is formed at the bump connecting portion forming step, since the lead is integrated with the ring, the bump connecting portion can be formed at the lead by easily and accurately adjusting the directions of the ring and the bump connecting portion relative to each other.

Further, in the above-described piezoelectric vibrator, it is preferable that an end portion of the ring disposed on a side of inside of the case is formed with a wire connecting portion projected to an inner peripheral side by providing a gap between the wire connecting portion and the lead and subjected to wire bonding to the other of the exciting electrodes.

Further, in the method of fabricating a piezoelectric vibrator, it is preferable that the method further comprises a ring forming step of forming the ring substantially by a shape of a cylinder and forming a wire connecting portion projected to an inner peripheral side at an end portion of the ring by pressing a plate member having a conductivity, wherein in the second mounting step, the wire bonding is carried out to the wire connecting portion of the ring.

According to the piezoelectric vibrator and the method of fabricating the piezoelectric vibrator according to the invention, in the second mounting step, the other of the exciting electrodes of the piezoelectric vibrating piece is electrically connected to the ring by subjecting the other to wire bonding with the wire connecting portion. Here, the wire connecting portion is provided to project to the inner peripheral side of the ring substantially in the cylindrical shape, and therefore, a range of arranging a bonding wire bonded to the other of the exciting electrodes and the wire connecting portion can be made to be smaller than the outer diameter of the ring and further small-sized formation can be achieved.

Further, in the above-described piezoelectric vibrator, it is preferable that the wire connecting portion of the ring is an inner flange projected to the inner peripheral side over an entire periphery thereof.

Further, in the method of fabricating a piezoelectric vibrator, it is preferable that in the ring forming step, as the wire connecting portion, an inner flange is formed by projecting the end portion of the ring to an inner peripheral side over an entire periphery thereof by pressing.

According to the piezoelectric vibrator and the method of fabricating the piezoelectric vibrator according to the invention, by constituting the wire connecting portion by the inner flange to the inner peripheral side of the ring over the entire periphery, in the ring forming step, the inner flange can easily be formed by pressing.

Further, in the piezoelectric vibrator, it is preferable that the other of the exciting electrodes of the piezoelectric vibrating piece and the ring are subjected to wire bonding by a plurality of wires.

Further, in the method of fabricating a piezoelectric vibrator, it is preferable that in the second mounting step, the other of the exciting electrodes of the piezoelectric vibrating piece and the ring are subjected to wire bonding by a plurality of wires.

According to the piezoelectric vibrator and the method of fabricating the piezoelectric vibrator according to the invention, by carrying out the wire bonding by the plurality of wires by the second mounting step, electric connection between the other of the exciting electrodes of the piezoelectric vibrating piece and the ring can further be ensured.

A piezoelectric vibrator of the invention comprises a case constituted by a shape of a bottomed cylinder having an opening portion and having a conductivity, a ring substantially constituted by a shape of a cylinder having a press-fitting portion press-fitted to the opening portion of the case and a diameter contracted portion extended from the press-fitting portion by providing a gap between an inner peripheral face of the case and the ring and having a conductivity, one piece of a lead inserted to the ring and having an inner lead portion projected to inside of the case and an outer lead portion projected to outside of the case, a filling member having an insulating property for sealing an interval between the lead and the ring in airtight, and a piezoelectric vibrating piece which is substantially constituted by a shape of a plate arranged at inside of the case and includes exciting electrodes respectively at both faces thereof and in which one of the exciting electrodes is supported by the inner lead portion by being subjected to bump connection with the inner lead portion of the lead and other of the exciting electrode on a side opposed to the one of the exciting electrode is subjected to wire bonding with an outer peripheral of the diameter contracted portion of the ring.

Further, the invention is a method of fabricating a piezoelectric vibrator arranged with a piezoelectric vibrating piece substantially constituted by a shape of a plate and having exciting electrodes respectively at both faces thereof at inside of a case constituted by a shape of a bottomed cylinder an opening portion of which is sealed in airtight by press-fitting a ring filled with a filling member at inside thereof, the method comprising a ring forming step of forming the ring by a shape including a press-fitting portion press-fitted to the case and a diameter contracted portion contracted and extended from the press-fitting portion by pressing a plate member having a conductivity, a filling member transferring step of inserting the filling member having an insulating property formed with a through hole to inside of the ring formed with the diameter contracted portion, a lead transferring step of inserting one piece of the lead to the through hole of the filling member inserted to inside of the ring to project from both sides thereof, a filling member sintering step of sintering the filling member along with the ring and the lead to integrate in airtight, a first mounting step of subjecting one of the exciting electrodes of the piezoelectric vibrating piece to bump connection with the inner lead portion of the lead projected from a side of the diameter contracted portion of the ring, a second mounting step of subjecting other of the exciting electrodes on a side opposed to the one of the exciting electrodes of the piezoelectric vibrating piece connected to the inner lead portion to wire bonding with an outer peripheral face of the diameter contracted portion of the ring, and a press-fitting step of press-fitting the ring to the opening portion of the case and sealing the piezoelectric vibrating piece connected to the inner lead portion to inside of the case in airtight.

According to the piezoelectric vibrator and the method of fabricating the piezoelectric vibrator according to the invention, the ring having the diameter contracted portion can be formed by the ring forming step, and the ring, the filling member and lead can be integrated by the filling member transferring step, the lead transferring step, and the filling member sintering step. Further, under the state, by subjecting the one of the exciting electrodes of the piezoelectric vibrating piece to bump connection with the inner lead portion of the lead in the first mounting step, the one of the exciting electrodes and the lead are brought into a conducted state and the piezoelectric vibrating piece is brought into a state of being supported by the inner lead portion of the lead. By subjecting the other of the exciting electrodes and the outer peripheral face of the contracted portion of the ring to wire bonding by the second mounting step, whereas the other of the exciting electrodes is brought into a conducted state with the ring, the lead and the one of the exciting electrodes can be brought into an insulating state by the filling member.

Further, when the press-fitting portion of the ring is press-fitted to the opening portion of the case having the conductivity in the press-fitting step, the piezoelectric vibrating piece is sealed in airtight to inside of the case, the one of the exciting electrodes is brought into a state of being connected to the lead, and the other of the exciting electrodes is brought into a state of being connected to the case by way of the ring. Here, the other of the exciting electrodes and the diameter contracted portion of the ring can be connected by arranging a bonding wire by utilizing a gap formed between the inner peripheral face of the case and the diameter contracted portion of the ring and the outer diameter of the case and the ring are not enlarged. Further, the ring is constituted by a simple structure of having the press-fitting portion and the diameter contracted portion contracted and extended from the press-fitting portion, and therefore, can easily be formed by pressing even when the outer diameter is reduced.

Further, in the piezoelectric vibrator, it is preferable that a portion of the outer peripheral face of the diameter contracted portion is provided with a step portion formed substantially by a flat face and subjected to wire bonding with the other of the exciting electrodes.

Further, in the method of fabricating a piezoelectric vibrator, it is preferable that in the ring forming step, the press-fitting portion and the diameter contracted portion are formed and a step portion substantially constituted by a flat face is formed at a portion of the outer peripheral face of the diameter contracted portion, and wherein in the second mounting step, the wire bonding is carried out at the step portions of the ring.

According to the piezoelectric vibrator and the method of fabricating the piezoelectric vibrator according to the invention, in the second mounting step, the other of the exciting electrodes of the piezoelectric vibrating piece is connected to the ring by being subjected to wire bonding with the step portion. Here, the step portion is formed substantially by the flat face, and therefore, conduction can be achieved by wire bonding further firmly. Further, even when the ring is constructed by a constitution including the step portion, only a portion of the outer peripheral face of the diameter contracted portion is formed substantially by the flat face, and therefore, the ring can easily be formed similarly by pressing.

Further, in the piezoelectric vibrator, it is preferable that a plurality of the step portions are formed substantially symmetrically with each other relative to a center of the ring, and wherein the other of the exciting electrodes is subjected to wire bonding with either one of the step portions.

Further, in the method of fabricating a piezoelectric vibrator, it is further preferable that the ring forming step, a plurality of the steps are formed substantially symmetrically with each other relative to a center axis of the ring, and wherein in the second mounting step, the wire bonding is carried out with either one of the step portions of the ring.

According to the piezoelectric vibrator and the method of fabricating the piezoelectric vibrator according to the invention, by forming the plurality of step portions substantially symmetrically with each other, a structure of a total of the ring can be formed by a structure symmetrical relative to the center axis. Therefore, handling in integrating the ring with the filling member and the lead is facilitated, further, also in the second mounting step, the wire bonding can selectively be carried out with any one of the plurality of step portions and the operation can be facilitated.

Further, in the piezoelectric vibrator, it is preferable that the other of the exciting electrodes of the piezoelectric vibrating piece and the diameter contracted portion of the ring are subjected to wire bonding by a plurality of wires.

Further, in the method of fabricating a piezoelectric vibrator, it is further preferable that in the second mounting step, the other of the exciting electrodes of the piezoelectric vibrating piece and the diameter contracted portion of the ring are subjected to wire bonding by a plurality of wires.

According to the piezoelectric vibrator and the method of fabricating the piezoelectric vibrator according to the invention, by caring out the wire bonding by the plurality of wires by the second mounting step, connection between the other of the exciting electrodes of the piezoelectric vibrating piece and the diameter contracted portion of the ring can further be ensured.

Further, in the piezoelectric vibrator, it is preferable that a portion of the inner lead portion of the lead is provided with a bump connecting portion formed substantially by a flat face and connected with the one of the exciting electrodes of the piezoelectric vibrating piece.

Further, in the method of fabricating a piezoelectric vibrator, it is preferable that the method further comprises a bump connecting portion forming step of forming a bump connecting portion substantially constituted by a flat face by pressing to crush a portion of the inner lead portion of the lead, wherein in the first mounting step, one of the exciting electrodes of the piezoelectric vibrating piece is subjected to bump connection with the bump connecting portion.

According to the piezoelectric vibrator and the method of fabricating the piezoelectric vibrator according to the invention, by subjecting the one of the exciting electrodes to bump connection with the bump connecting portion formed substantially by the flat face by the bump connecting potion forming step and the first mounting step, conduction between the one of the exciting electrodes and the lead can be achieved and the piezoelectric vibrating piece can be brought into a state of being supported by the lead further firmly. Further, by forming the bump connecting portion substantially by the flat face by pressing to crush a portion of the inner lead portion, the lead and the piezoelectric vibrating piece can be arranged at positions substantially equal to the center axis of the case and the ring and small-sized formation of the case and the ring can further be achieved.

Further, in the method of fabricating a piezoelectric vibrator, it is preferable that the bump connecting portion forming step is carried out after the filling member sintering step.

According to the method of fabricating a piezoelectric vibrator according to the invention, by carrying out the bump connecting portion forming step after the filling member sintering step, in the lead transferring step and the filling member sintering step, it is not necessary to adjust directions of the diameter contracted portion of the ring and the bump connecting portion of the lead relative to each other. Further, when the bump connecting portion is formed by the bump connecting portion forming step, since the lead is integrated with the ring, the bump connecting portion can be formed at the lead by easily and accurately adjusting directions of the lead and the diameter contracted portion of the ring relative to each other.

Further, in the piezoelectric vibrator, it is preferable that the piezoelectric vibrator further comprises a second outer lead portion formed to project in an outer direction from a side opposed to the opening portion of the case, a resin member for covering the outer lead portion, the case and the second outer lead portion, and a pair of external connection terminals including fitting grooves fitted with the outer lead portion and the second outer lead portion by being widened elastically in widths thereof, at least portions thereof being exposed from the resin member to be able to be conducted from outside.

According to the piezoelectric vibrator according to the invention, as the surface mounting type, the piezoelectric vibrator can be mounted on the board by a smaller space and space saving formation on the board can be achieved.

Particularly, the filling groove of the external connection terminal is widened elastically, and therefore, the outer lead portion and the second outer lead portion can be fitted to the fitting groove by being pressed thereto. Therefore, even when small-sized formation is carried out as a whole, the outer lead portion and the second outer lead portion and the external connection terminals can easily be connected. Further, after having being fitted, the fitting groove is elastically recovered, and therefore, the outer lead portion and the second outer lead portion are pinched to be firmly fixed. Therefore, the conduction can firmly be achieved.

Further, according to an oscillator of the invention, the above-described piezoelectric vibrator is connected to an integrated circuit as an oscillating piece.

Further, an electronic apparatus of the invention comprises the above-described piezoelectric vibrator.

Further, according to a radio wave timepiece of the invention, the above-described piezoelectric vibrator is electrically connected to a filter portion.

According to the oscillator, the electronic apparatus, and the radio wave timepiece according to the invention, there is provided the piezoelectric vibrator which is small-sized and in which there is not a concern of shortcircuit, and therefore, an oscillator, an electronic apparatus, and a radio wave timepiece which are small-sized and highly reliable can be provided.

According to the piezoelectric vibrator and the method of fabricating the piezoelectric vibrator of the invention, small-sized formation can be achieved while preventing the exciting electrodes from being shortcircuited to each other and fabrication can be carried out easily and with excellent yield.

Further, according to the oscillator, the electronic apparatus and the radio wave timepiece of the invention, by providing the piezoelectric vibrator, small-sized formation and promotion of reliability can be achieved.

BRIEF DESCRIPTION OF THE DRAWINGS

FIG. 4 is a flowchart showing steps of fabricating the piezoelectric vibrator according to the first embodiment of the invention;

FIGS. 6A, 6B and 6C are explanatory views showing a step of forming a ring in steps of fabricating the piezoelectric vibrator according to the first embodiment of the invention;

FIGS. 34A and 34B are outline views of a unit frame in steps of fabricating the piezoelectric vibrator according to the second embodiment of the invention;

FIGS. 35A and 35B are explanatory views showing a airtight terminal inserting step in steps of fabricating the piezoelectric vibrator according to the second embodiment of the invention;

DETAILED DESCRIPTION OF THE PREFERRED EMBODIMENTS

First Embodiment

Figure 1:
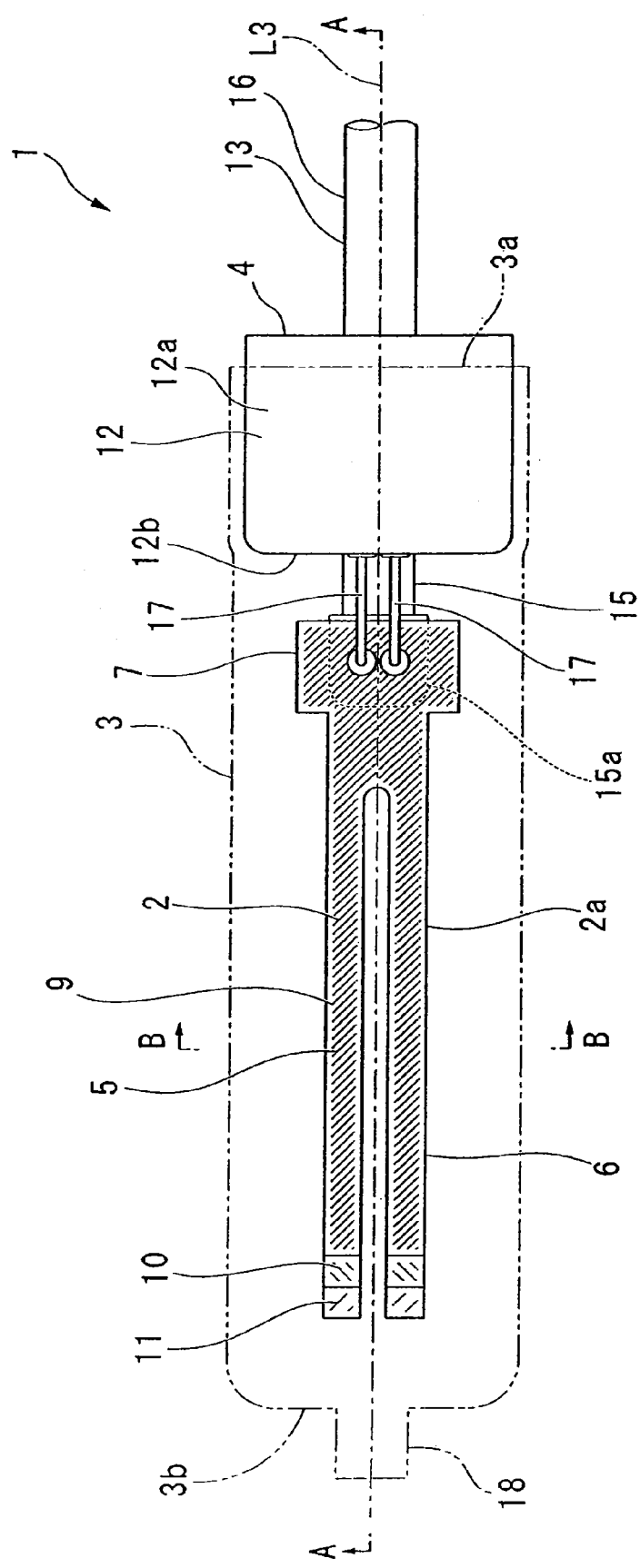
FIG. 1 is a top view of a piezoelectric vibrator according to a first embodiment of the invention.

FIG. 1 through FIG. 22 show a first embodiment according to the invention. FIG. 1 is a total view of a piezoelectric vibrator according to the embodiment. Further, a case 3 mentioned later is indicated by a two-dotted chain line for explaining an inside thereof in details. Further, FIG. 2 shows a sectional view taken along a cut line A-A showing FIG. 1 and FIG. 3 shows a sectional view taken along a cut line B-B thereof.

Figure 2:
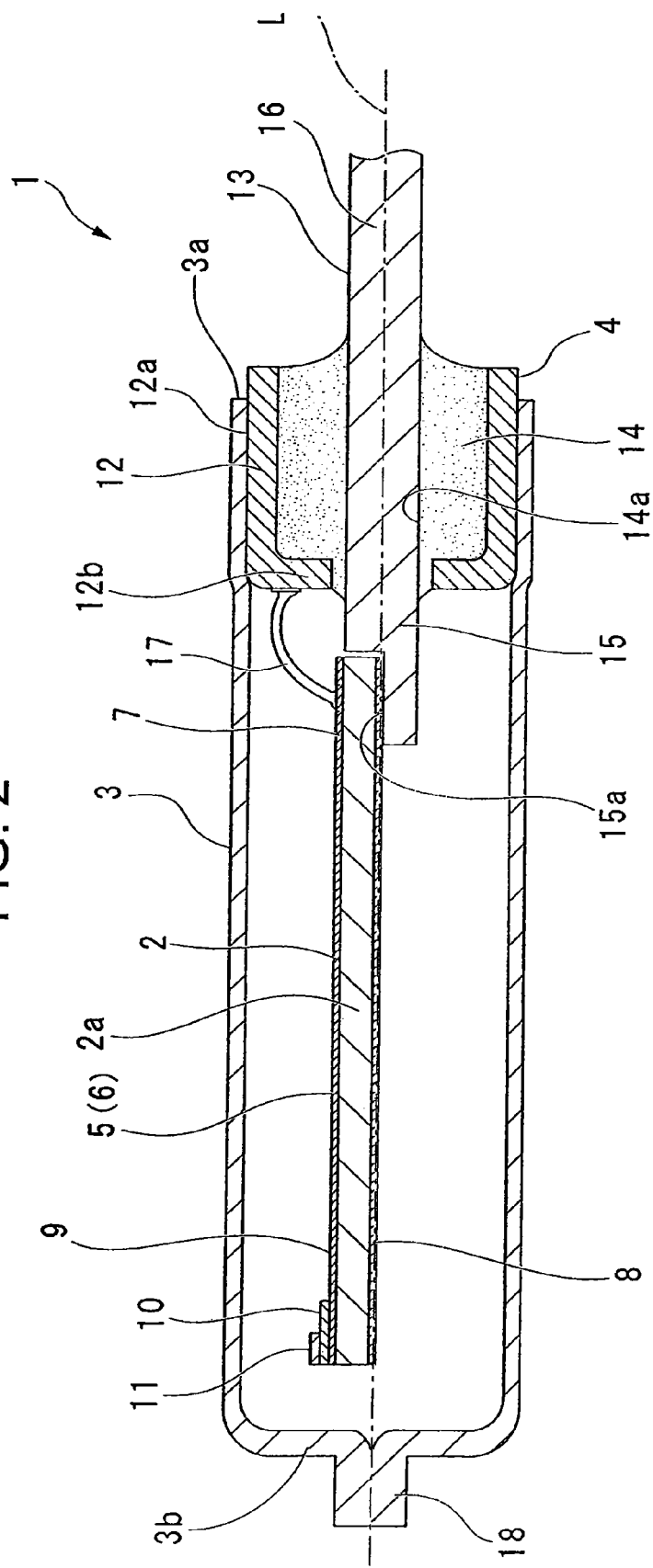
FIG. 2 is a sectional view taken along a cut line A-A shown in FIG. 1 of the piezoelectric vibrator according to the first embodiment of the invention.
Figure 3:
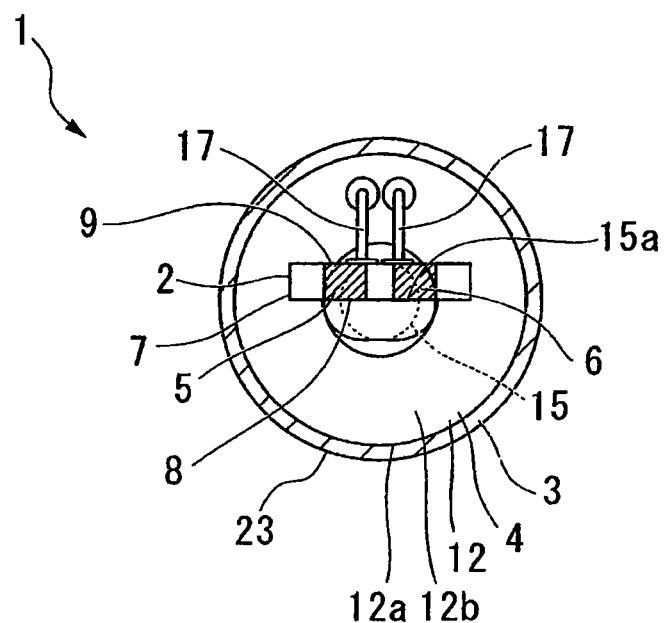
FIG. 3 is a sectional view taken along a cut line B-B shown in FIG. 1 of the piezoelectric vibrator according to the first embodiment of the invention.

As shown by FIG. 1 through FIG. 3, a piezoelectric vibrator 1 of the embodiment is a cylinder package type piezoelectric vibrator, including a piezoelectric vibrating piece 2, a case 3 substantially in a shape of a bottomed cylinder arranged with the piezoelectric vibrating piece 2 at inside thereof for covering an outer periphery thereof, and an airtight terminal 4 for sealing an opening portion 3a of the case 3 in airtight. In a case of the embodiment, the piezoelectric vibrating piece 2 is a tuning fork type vibrating piece and formed by a pair of vibrating arm portions 5, 6 arranged in parallel with each other in a contiguous state, and a quartz piece 2a substantially in a plate-like shape including a base portion 7 for integrally fixing base end sides of the vibrating arm portions 5, 6.

Further, both faces of the quartz piece 2a are respectively provided with a first exciting electrode 8 and a second exciting electrode 9 formed with conductive films of chromium (Cr), nickel (Ni), aluminum (Al), titanium (Ti) or the like by a predetermined pattern. The first exciting electrode 8 and a second exciting electrode 9 are patterned by being electrically isolated from each other. Further, by applying voltage to respectives of the first exciting electrode 8 and the second exciting electrode 9, the vibrating arm portions 5, 6 can be vibrated by a predetermined resonance frequency in directions of being proximate to each other or remote from each other.

Further, on front end sides of the vibrating arm portions 5, 6, at least one of the first exciting electrode 8 and the second exciting electrode 9 is provided with a finely adjusting portion 10 and a roughly adjusting portion 11 formed by chromium (Cr) films or the like and the vibrating arm portions 5, 6 are set to the predetermined resonance frequency by machining the finely adjusting portion 10 and the roughly adjusting portion 11 by irradiating a laser beam or the like thereto.

The airtight terminal 4 includes a ring 12 substantially in a cylindrical shape press-fitted to an opening portion 3a of the case 3, 1 piece of lead 13 inserted into the ring 12, and a filling member 14 filled between the ring 12 and the lead 13 at inside of the ring 12 for sealing in airtight. The filling member 14 is formed by a material having an insulating property and according to the embodiment, the filling member 14 is a glass ring formed by borosilicate glass for insulating the ring 12 and the lead 13 and sealing inside of the case 3 in airtight by inserting the lead 13 into the through hole 14a to sinter in a state of being inserted to inside of the ring 12.

The lead 13 is arranged coaxially with a center axis L3 of the case 3 and includes an inner lead portion 15 projected from the ring 12 to a side of an inner portion of the case 3, and a first outer lead portion 16 projected from the ring 12 to a side of an outer portion of the case 3. A front end side of the inner lead portion 15 is provided with a bump connecting portion 15a formed substantially by a flat face. The bump connecting portion 15a is formed by pressing to crush a portion of the lead 13 to constitute substantially the flat face up to a vicinity of the center axis L3. Further, the bump connecting portion 15a is connected with the first exciting electrode 8 of the piezoelectric vibrating piece 2 by a bump at the base portion 7, thereby, the first exciting electrode 8 and the lead 13 are brought into an electrically connected state, and the piezoelectric vibrating piece 2 is brought into a state of being supported in a cantilever style by the inner lead portion 15 of the lead 13.

The ring 12 includes a main body portion 12a substantially in a cylindrical shape, and a wire connecting portion 12b folded to bend substantially by 90 degrees from an end portion of the main body portion 12a disposed on a side of the inner portion of the case 3 to an inner peripheral side. Further in details, the wire connecting portion 12b is an inner flange projected to the inner peripheral side over an entire periphery of the main body portion 12a and is brought into a state of having a gap between the wire connecting portion 12b and the lead 13 inserted to inside thereof. Further, the ring 12 is formed by a conductive material and preferably a material having a thermal expansion coefficient to a degree the same as that of glass forming the filling member 14 and, for example, iron nickel cobalt alloy, iron nickel alloy or the like is selected. Further, the wire connecting portion 12b of the ring 12 and the second exciting electrode 9 of the piezoelectric vibrating piece are subjected to wire bonding by a wire 17 to be electrically connected. Further, according to the embodiment, 2 pieces of the wires 17 are provided.

The case 3 is formed by a conductive material and includes the opening portion 3a on one end side and includes a bottom portion 3b on other end side. Further, by press-fitting the ring 12 of the airtight terminal 4 to the opening portion 3a, inside thereof is brought into a vacuum state to be sealed in airtight. Further, the bottom portion 3b is formed with a second outer lead portion 18 projected to outside. Therefore, according to the piezoelectric vibrator 1 of the embodiment, outside of the case 3 is made to be able to be conducted to the first exciting electrode 8 of the piezoelectric vibrating piece 2 by way of the lead 13 by the first outer lead portion 16 and outside of the case 3 is made to be able to be conducted to the second exciting electrode 9 of the piezoelectric vibrating piece 2 by way of the case 3, the ring 12 and the wire 17 by the second outer lead portion 18.

Further, in the ring 12 of the airtight terminal 4, a portion of the wire connecting portion 12b bonded with the wire 17 and the bump connecting portion 15a of the lead 13 are respectively subjected to gold plating, not illustrated, partially to improve conduction. As the gold plating, a film is formed by a film thickness of about several thousands Å at the wire connecting portion 12b and the bump connecting portion 15a. Next, a method of fabricating the piezoelectric vibrator 1 will be explained.

FIG. 4 shows a flowchart of steps of fabricating the piezoelectric vibrator 1 according to the embodiment, and FIG. 5 through FIG. 22 show explanatory views of respective fabricating steps. Steps of fabricating the piezoelectric vibrator 1 of the embodiment are grossly classified into a piezoelectric vibrating piece fabricating step S10, an airtight terminal fabricating step S20 for fabricating the airtight terminal 4, and an integrating step S30 of integrating the piezoelectric vibrating piece 2, the airtight terminal 4 and the case 3. Details thereof will respectively be explained as follows.

Figure 5:
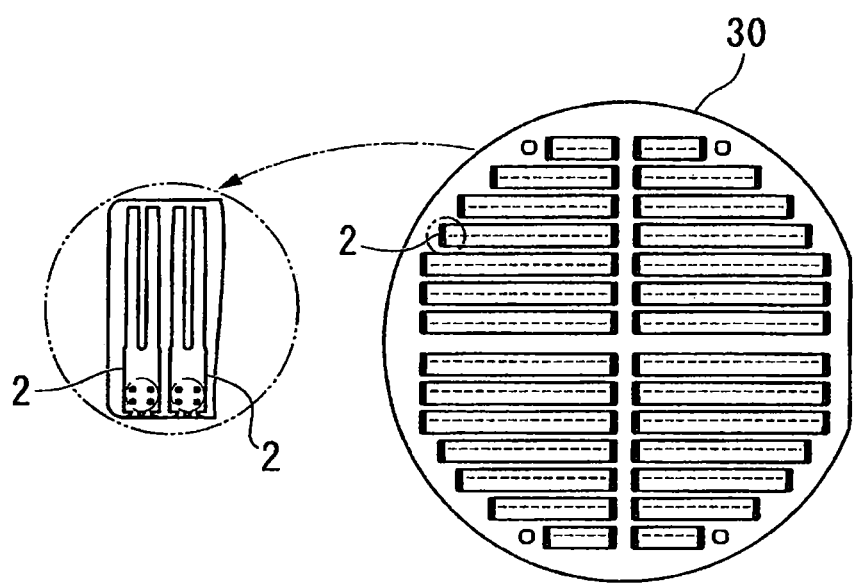
FIG. 5 is an explanatory view showing a step of fabricating the piezoelectric vibrator in steps of fabricating the piezoelectric vibrator according to the first embodiment of the invention.

At the piezoelectric vibrating piece fabricating step S10, first, Lambert raw stone of quartz is sliced to fabricate a wafer having a predetermined thickness, further, the wafer is polished until constituting a constant thickness. Further, a plurality of the quartz pieces 2a can be fabricated from the wafer by patterning and etching an outer shape of the quartz piece 2a from the wafer by a photolithography technology. Next, for each of the fabricated quartz pieces 2a, metal films for constituting the first exciting electrode 8, the second exciting electrode 9, the finely adjusting portion 10, the roughly adjusting portion 11 and the like are formed. Further, for each of the quartz pieces 2a, a weight thereof is changed by evaporating a portion of the metal film forming the roughly adjusting portion 11 by irradiating a laser beam to the roughly adjusting portion 11, thereby, the resonance frequency of the quartz piece 2a is roughly adjusted to finish the piezoelectric vibrating piece 2. Further, a fine adjustment of adjusting the resonance frequency of the quartz piece 2a highly accurately is carried out after having been integrated to the airtight terminal 4. Further, a plurality of the piezoelectric vibrating pieces 2 fabricated in this way are aligned on an exclusive pallet 30 as shown by FIG. 5 and is carried to an integrating step S30 mentioned later.

Next, the airtight terminal fabricating step S20 will be explained. As the airtight terminal fabricating step S20, first, the ring 12 is fabricated as a ring forming step S21. That is, as shown by FIG. 6A, by subjecting a plate member 31 having a conductivity of iron nickel cobalt alloy, iron nickel alloy or the like forming the ring 12 to lancing and thereafter subjecting the plate member 31 to deep drawing by a plurality of times, a bottomed cylindrical member 32 substantially equal to an outer diameter of a final shape of the ring 12 is formed. Further, a working position of forming the cylindrical member 32 is positioned accurately by a pilot hole, not illustrated, previously formed at the plate member 31, thereby, a plurality of the cylinder members 32 can be aligned to form. Next, as shown by FIG. 6B, by punching a ceiling hole 32b of a center position at a bottom portion 32a of each cylindrical member 32, the wire connecting portion 12b in a shape of an inner flange is formed. Finally, as shown by FIG. 6C, by punching an outer shape thereof, the cylindrical member 32 is separated from the plate member 31 to finish the ring 12.

Figure 7:
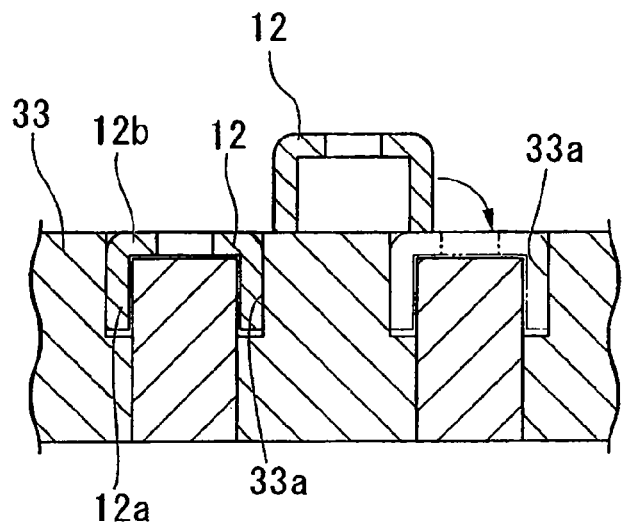
FIG. 7 is an explanatory view showing a ring transferring step in steps of fabricating the piezoelectric vibrator according to the first embodiment of the invention.
Figure 8:
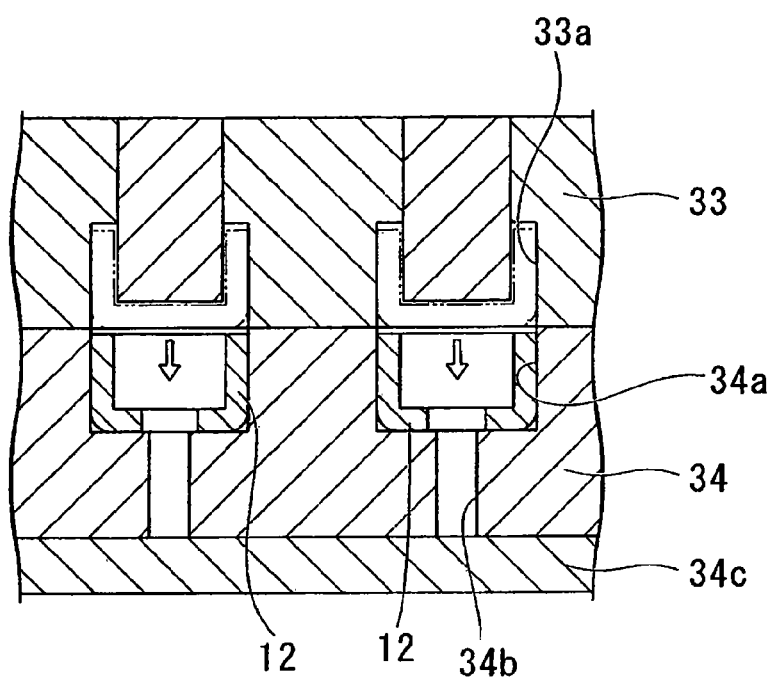
FIG. 8 is an explanatory view showing the ring transferring step in steps of fabricating the piezoelectric vibrator according to the first embodiment of the invention.

Next, the ring 12, the lead 13 and the filling member 14 are integrated. That is, first, as a ring transferring step S22, as shown by FIG. 7, the plurality of rings 12 formed at the ring forming step S21 are charged to a transferring jig 33 having a plurality of recess portions 33a in correspondence with the shape of the ring 12. At this occasion, the transferring jig 33 is vibrated and the plurality of rings 12 are mounted to the respective recess portions 33a successively by directing the wire connecting portion 12a to an upper side. Next, as shown by FIG. 8, a carbon jig for ring 34 is prepared. The carbon jig for ring 34 is formed by carbon to be able to be used when the filling member 14 is sintered at a filling member sintering step S25 mentioned later, and is formed with a recess portion 34a to be able to charge the ring 12 to direct to the wire connecting portion 12b to a lower side.

A bottom face of the recess portion 34a is formed with an inserting hole 34b coaxial with the recess portion 34a and capable of inserting the lead 13. A depth of the inserting hole 34b is made to correspond to a length of the inner lead portion 15 of the lead 13 and is closed by a bottom plate 34c. Further, by turning the transferring jig 33 charged with the rings 12 upside down to mount on an upper face of the carbon jig for ring 34, the rings 12 are respectively charged to the recess portions 34a of the carbon jig for ring 34 by directing the wire connecting portions 12b to the lower side. Further, the transferring jig 33 and the carbon jig for ring 34 are provided with a positioning pin and a positioning hole, not illustrated, in correspondence with each other, thereby, the rings 12 can be moved by making the respective recess portions 33a, 34a opposed to each other.

Figure 9:
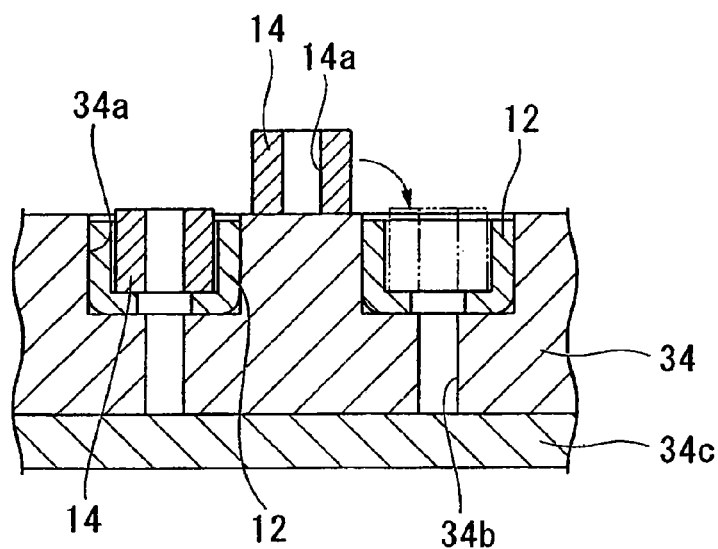
FIG. 9 is an explanatory view showing a filling member transferring step in steps of fabricating the piezoelectric vibrator according to the first embodiment of the invention.

Next, as a filling member transferring step S23, as shown by FIG. 9, the filling members 14 are inserted to insides of the respective rings 12 charged to the recess portions 34a of the carbon jig for ring 34. The filling member 14 is constituted by a shape having an outer diameter capable of being inserted to inside of the ring 12 and having the through hole 14a capable of inserting the lead 13, in the shape before the filling member 14 is sintered in a filling member sintering step S25 described below. Further, by mounting the plurality of filling members 14 on an upper side of the carbon jig for ring 34 and vibrating the carbon jig for ring 34, the respective filling members 14 are inserted to insides of the rings 12.

Figure 10:
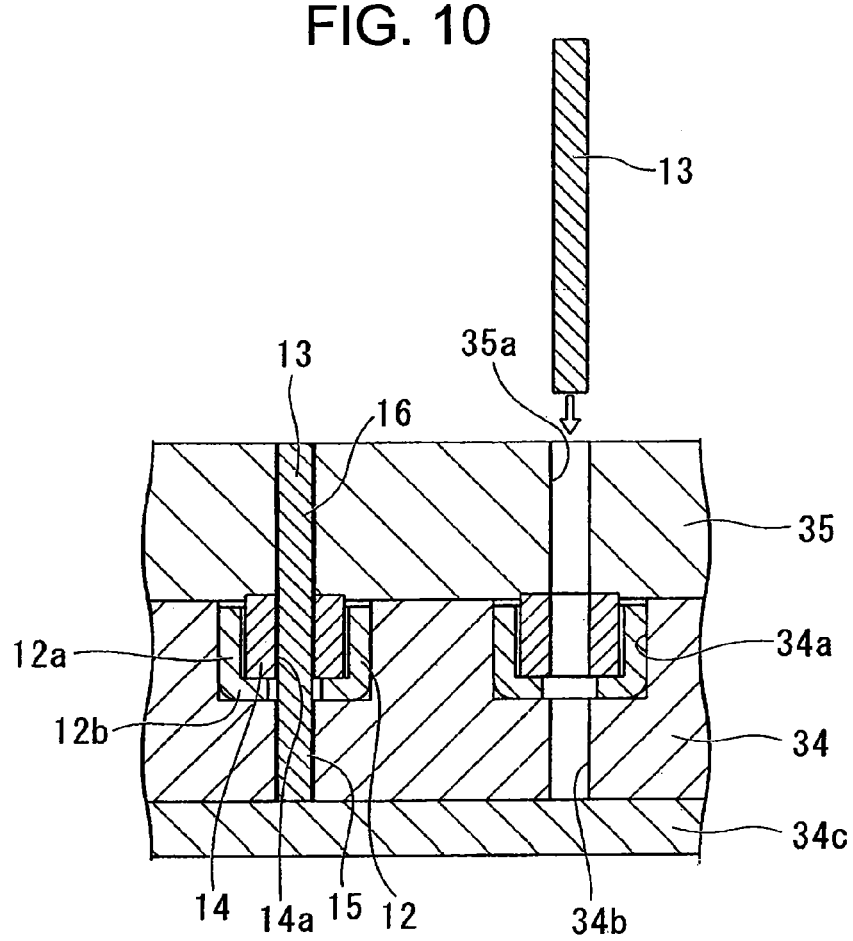
FIG. 10 is an explanatory view showing a lead transferring step in steps of fabricating the piezoelectric vibrator according to the first embodiment of the invention.

Next, as a lead transferring step S24, as shown by FIG. 10, the leads 13 are inserted into the through holes 14a of the filling members 14 inserted to insides of the respective rings 12. First, a carbon jig for lead 35 is mounted on an upper face of the carbon jig for ring 34 charged with the rings 12 and the filing members 14. The carbon jig for lead 35 is formed with a plurality of through holes 35a capable of inserting the leads 13. Further, the carbon jig for ring 34 and the carbon jig for lead 35 are provided with a positioning pin and a positioning hole, not illustrated, in correspondence with each other, thereby, the recess portion 34a and the through hole 35a are coaxially arranged in a state of being integrated to each other. Further, by mounting the plurality of leads 13 on an upper face of the carbon jig for lead 35 and vibrating the carbon jig for ring 34 and the carbon jig for lead 35, the respective leads 13 are inserted to the through holes 14a of the filling members 14 inserted to the rings 12 and integrated to the rings 12 and the filling members 14 in a state of projecting the inner lead portions 15 to lower side of the rings 12 and projecting the first outer lead portions 16 to upper sides of the rings 12.

Figure 11:
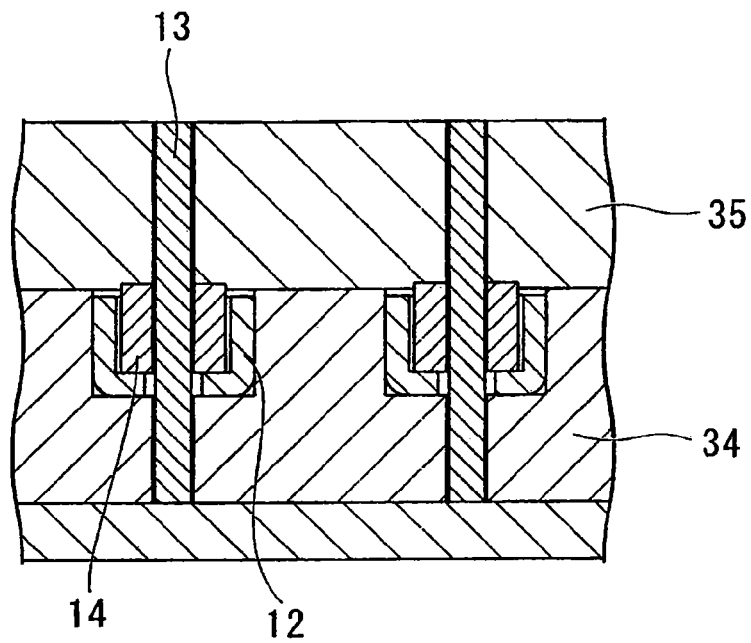
FIG. 11 is an explanatory view showing a filling member sintering step in steps of fabricating the piezoelectric vibrator according to the first embodiment of the invention.
Figure 12:
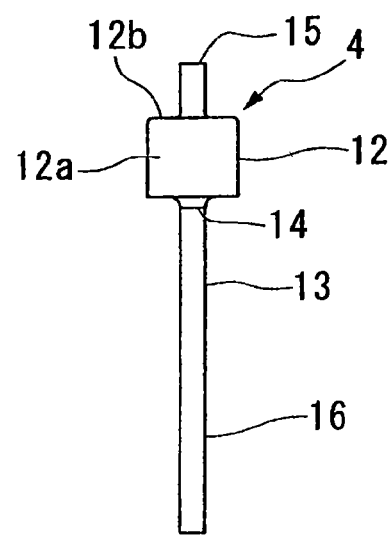
FIG. 12 is an outline view showing an airtight terminal fabricated by an airtight terminal fabricating step in steps of fabricating the piezoelectric vibrator according to the first embodiment of the invention.

Next, as the filling member sintering step S25, the filling member 14 is sintered in a state of being integrated to the ring 12 and the lead 13. That is, as shown by FIG. 11, the carbon jig for ring 34 and the carbon jig for lead 35 are arranged at inside of a heating furnace and heated at a predetermined temperature in a state of being charged with the rings 12, the leads 13 and the filling members 14 at insides thereof. Thereby, the filling member 14 is sintered to seal intervals with respectives of the ring 12 and the lead 13 in airtight, further, the ring 12, the lead 13 and the filling member 14 are integrated and the airtight terminal portion 4 is formed as shown by FIG. 12. Further, the bump connecting portion 15a of the inner lead portion 15 of the lead 13 is formed at a bump connecting portion forming step S27 mentioned later.

Figure 13A:
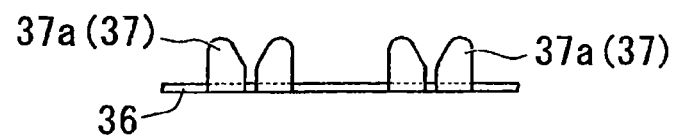
FIGS. 13A and 13B are outline views of a unit frame in steps of fabricating the piezoelectric vibrator according to the first embodiment of the invention.
Figure 13B:
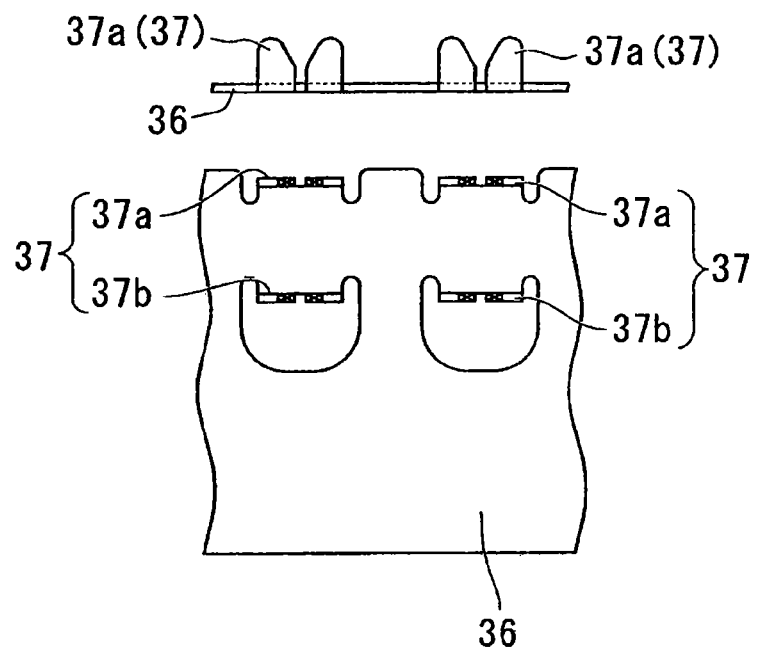
Figure 14A:
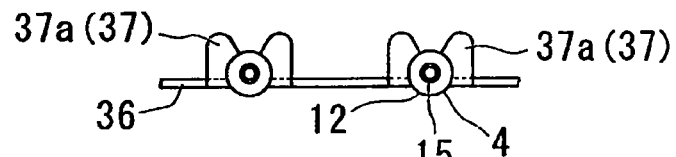
FIGS. 14A and 14B are explanatory views showing an airtight terminal inserting step in steps of fabricating the piezoelectric vibrator according to the first embodiment of the invention.
Figure 14B:
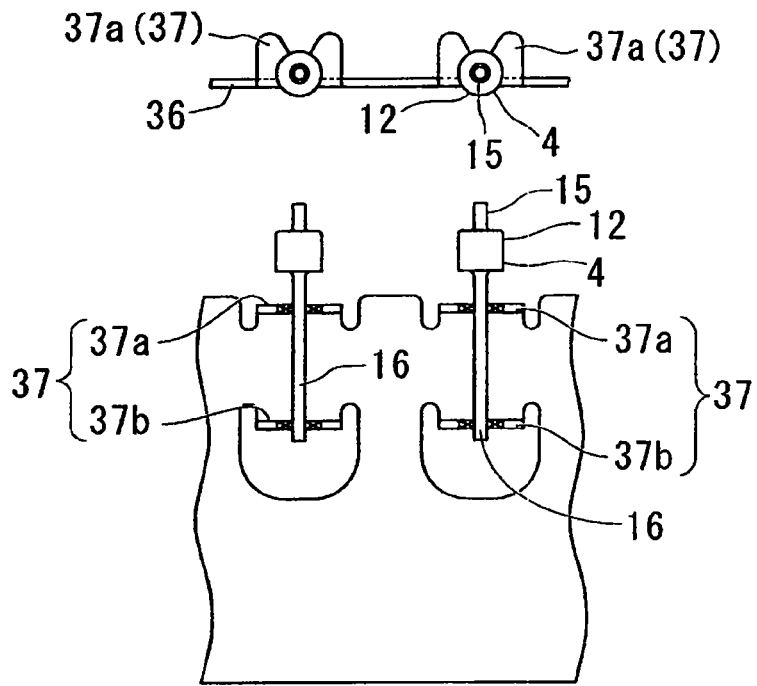

Next, as an airtight terminal inserting step S26, the airtight terminal 4 is removed from the carbon jig for ring 34 and the carbon jig for lead 35 and is aligned at a unit frame 36. FIGS. 13A and 13B show the unit frame 36 before aligning the airtight terminal 4 and FIGS. 14A and 14B shows the unit frame 36 after aligning the airtight terminal 4. The unit frame 36 is a member continuous in a strip-like shape and provided with a plurality of airtight terminal arranging portions 37 in a longitudinal direction at equal intervals although an illustration thereof is omitted in FIGS. 13A, 13B. The airtight terminal arranging portion 37 is constituted by a pair of fitting portions 37a and 37b capable of fitting the first outer lead portion 16 of the lead 13 at each airtight terminal 4. Further, as shown by FIGS. 14A, 14B, each airtight terminal 4 formed by the above-described step is arranged at each airtight terminal arranging portion 37 of the unit frame 36 by fitting the first outer lead portion 16 to the pair of fitting portions 37a, 37b.

Figure 15A:
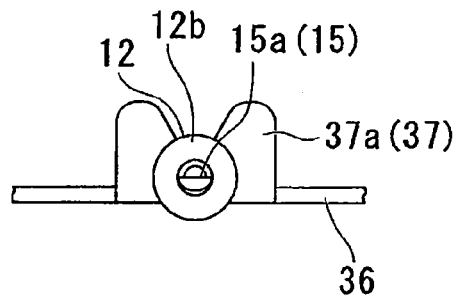
FIGS. 15A and 15B are explanatory views showing a bump connecting portion forming step in steps of fabricating the piezoelectric vibrator according to the first embodiment of the invention.
Figure 15B:
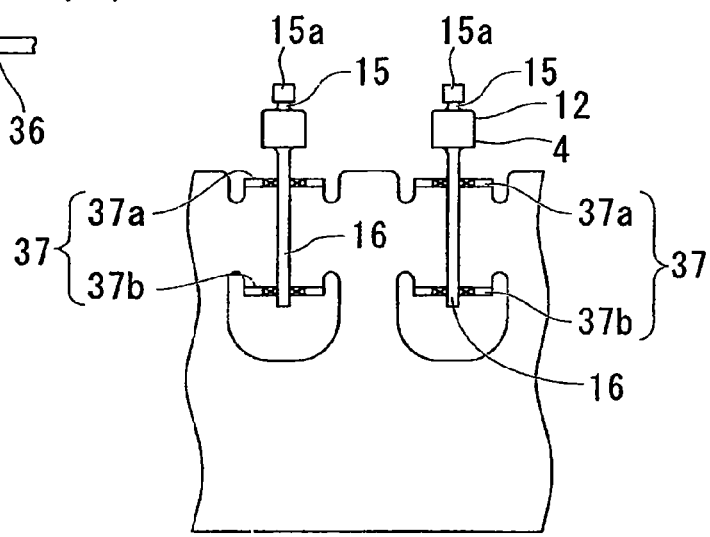

Next, as a bump connecting portion forming step S27, the bump connecting potion 15a is formed at the inner lead portion 15 of each airtight terminal 4. That is, as shown by FIGS. 15A, 15B, while moving the unit frame 36, the front end portion of the inner lead 15 of each airtight terminal 4 projected from the unit frame 36 is successively pressed to crush from above. Here, by carrying out the bump connecting portion forming step S27 after the filling member sintering step S25 as in the embodiment, it is not necessary to adjust a direction of the ring 12 and the lead 13 relative to the bump connecting portion 15a in carrying out the lead transferring step S24 and the filling member sintering step S25. Further, when the bump connecting portion 15a is formed at the bump connecting portion forming step S27, the lead 13 is integrated to the ring 12, and therefore, the bump connecting portion 15a can be formed by easily and accurately adjusting a direction thereof relative to the ring 12. Further, by carrying out the bump connecting portion forming step S27 after the airtight terminal inserting step S26, whereas at the airtight terminal inserting step S26, the airtight terminal 4 can be arranged with no necessity of matching a direction thereof around a center axis, after the bump connecting portion forming step S27, the bump connecting portions 15a of all of the airtight terminals 4 can be formed in a state of being directed to an upper side in correspondence with the unit frame 36.

Figure 16:
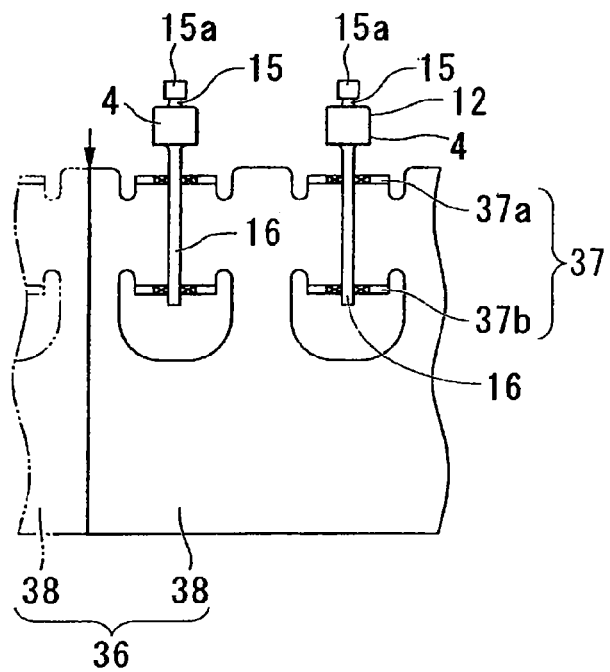
FIG. 16 is an explanatory view showing a frame cutting step in steps of fabricating the piezoelectric vibrator according to the first embodiment of the invention.
Figure 17:
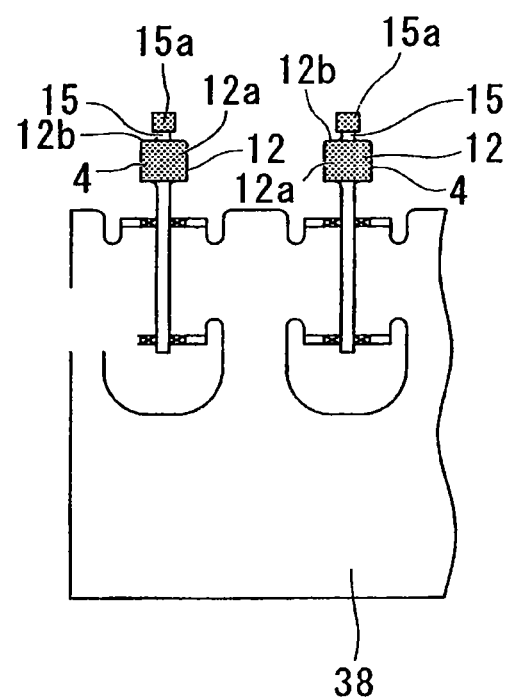
FIG. 17 is an explanatory view showing a plating step in steps of fabricating the piezoelectric vibrator according to the first embodiment of the invention.

Next, as a frame cutting step S28, as shown by FIG. 16, the unit frame 36 in the strip-like shape is cut at each predetermined length. Hereinafter, the unit frame after having been cut is referred to as a pallet 38. Next, as a plating step S29, as shown by FIG. 17, gold is plated to an outer peripheral face of the main body portion 12a and the wire connecting portion 12b of the ring 12 at each airtight terminal 4 as well as the bump connecting portion 15a of the lead 13 at each pallet 38.

In plating, substrate plating and finish plating are carried out. As substrate plating, for example, copper plating is carried out. In finish plating of the outer peripheral face of the main body portion 12a of the ring 12, for example, tin copper alloy plating is carried out by a film thickness of several μm through ten μm in order to maintain airtightness by press-fitting the main body portion 12a to the case 13. In finish plating of the wire connecting portion 12b and the bump connecting portion 15a, gold plating is carried out.

Gold plating at the wire connecting portion 12b is for carrying out wire bonding mentioned later and gold plating at the bump connecting portion 15a of the lead 13 for bump connection with the first exciting electrode 8 of the piezoelectric vibrating piece 2 mentioned later. Gold plating of the wire connecting portion 12b and the bump connecting portion 15a is formed by a film thickness, for example, about several thousands Å.

Further, tin copper alloy plating may be carried out at the wire connecting portion 12b and the bump connecting portion 15a and gold plating may be carried out further thereon. Further, gold plating may further be carried out on a surface of tin copper alloy plating of the main body portion 12a of the ring 12.

Thereby, all of the steps of the airtight terminal fabricating step S20 are finished.

Figure 18A:
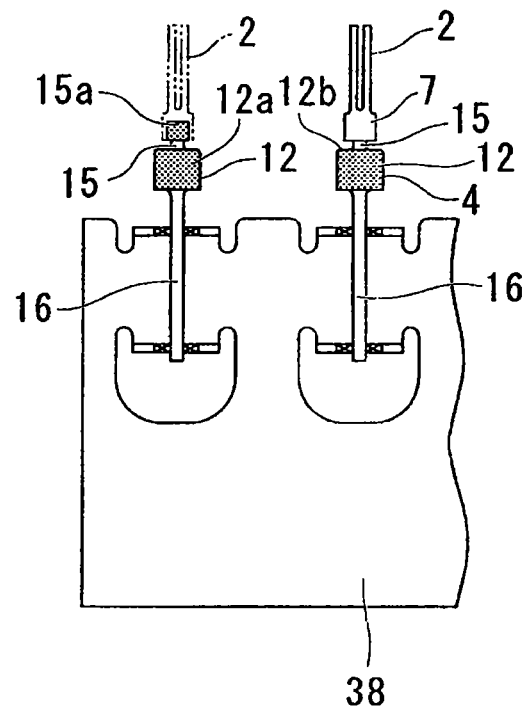
FIGS. 18A and 18B are explanatory view showing a first mounting step in steps of fabricating the piezoelectric vibrator according to the first embodiment of the invention.
Figure 18B:
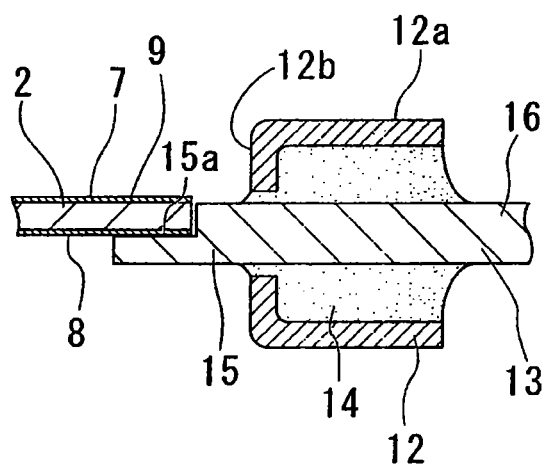

Next, as the integrating step S30, the piezoelectric vibrating piece 2, the case 3, and the airtight terminal 4 are integrated. First, as a first mounting step S31, as shown by FIGS. 18A, 18B, at the pallet 38, the piezoelectric vibrating piece 2 is mounted to the inner lead portion 15 of each airtight terminal 4. That is, the piezoelectric vibrating piece 2 fabricated by the piezoelectric vibrating piece fabricating step S10 is taken out from above the exclusive pallet 30. Further, the first exciting electrode 8 of the taken-out piezoelectric vibrating piece 2 is subjected to bump connection with the bump connecting portion 15a applied with gold plating by the base portion 7 at the inner lead portion 15 of each airtight terminal 4. As conditions of bump connection, for example, mounting temperature is 130° C., bonding load is 0.5 N, loading time is about $15 \times 10^{-3}$ second. Thereby, the first exciting electrode of the piezoelectric vibrating piece 2 and the lead 13 are brought into an electrically connected state and the piezoelectric vibrating piece 2 is brought into a state of being supported by the inner lead portion 15 of the lead 13 in the cantilever state.

Here, the portion of subjecting the piezoelectric vibrating piece 2 to bump connection at the inner lead portion 15 of the lead 13 is formed substantially by a flat face as the bump connecting portion 15a, and therefore, the first exciting electrode 8 and the lead 13 can be conducted further firmly and the piezoelectric vibrating piece 2 can be supported by the lead 13. Further, by pressing to crush to form the bump connecting portion 15a up to a position substantially equal to a center axis of the lead 13, the piezoelectric vibrating piece 2 can be bonded to the lead 13 at the position substantially equal to the center axis of the lead 13.

Figure 19A:
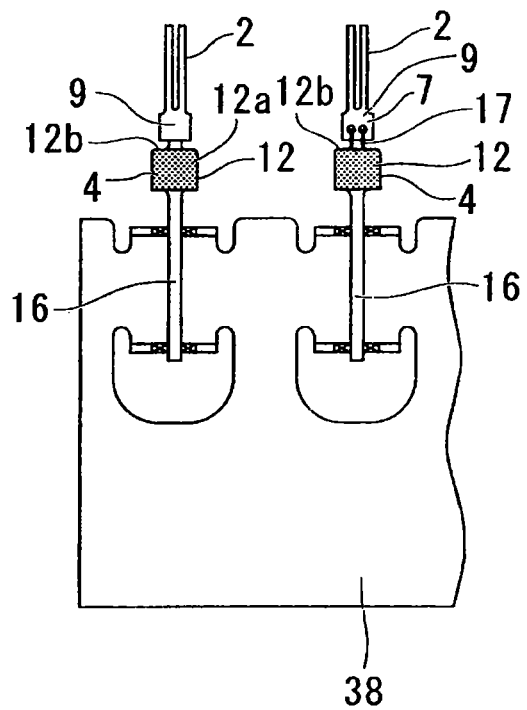
FIGS. 19A and 19B are explanatory views showing a second mounting step in steps of fabricating the piezoelectric vibrator according to the first embodiment of the invention.
Figure 19B:
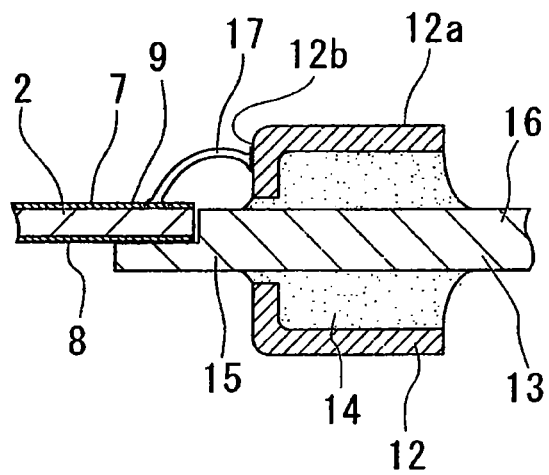

Next, as a second mounting step S32, as shown by FIG. 19, the wire connecting portion 12b of the ring 12 of each airtight terminal 4 and the second exciting electrode 9 of the piezoelectric vibrating piece 2 mounted to each airtight terminal 4 are bonded by wire bonding. According to the embodiment, 2 pieces of the wires 17 are bonded between the wire connecting portion 12b and the second exciting electrode 9. As the wire 17 used for example, a gold (Au) wire is selected, one end of the wire 17 is bonded to the second exciting electrode 9 at the base portion 7 of the piezoelectric vibrating piece 2, thereafter, other end is bonded to the wire connecting portion 12b of the ring 12. As respective conditions of the wire bonding, for example, a mounting temperature is 130° C., a wire diameter is 25 μm, a ball diameter is 80 through 85 μm, a ball thickness is 13 μm, a shear strength is 0.45 through 0.53 N, when the wire is bonded to the second exciting electrode 9, a bonding load is 0.55 N, loading time is $7 \times 10^{-3}$ second, when the wire is bonded to the wire connecting portion 12b, a bonding load is 0.4 N, loading time is about $5 \times 10^{-3}$ second.

Thereby, the second exciting electrode 9 of the piezoelectric vibrating piece 2 and the ring 12 are brought into an electrically connected state. Particularly, by connecting these by the plurality of wires 17, conduction can firmly be achieved. Further, the lead 13 electrically connected to the first exciting electrode 8 and the ring 12 electrically connected to the second exciting electrode 9 are brought into a state of being insulated from each other by interposing the insulating filling member 14 therebetween, thereby, the first exciting electrode 8 and the second exciting electrode 9 of the piezoelectric vibrating piece 2 can be brought into a state of being insulated from each other to thereby prevent shortcircuit.

Figure 20:
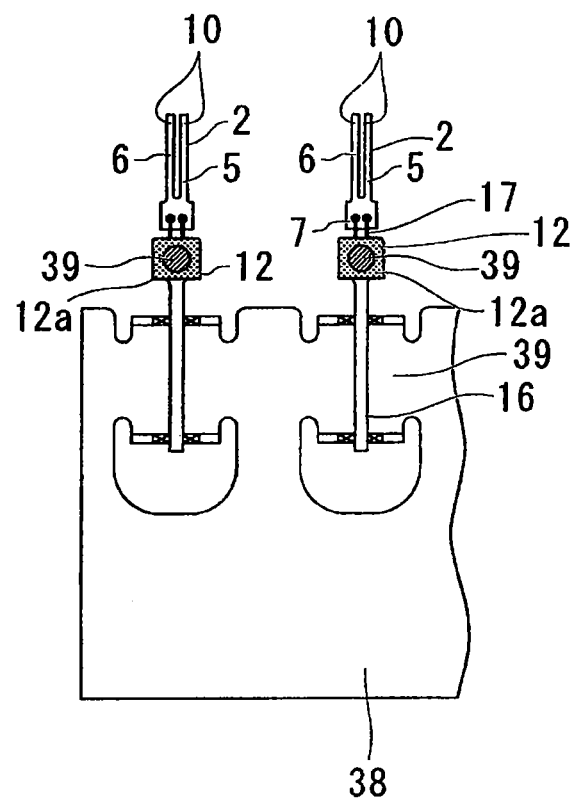
FIG. 20 is an explanatory view showing a finely adjusting step in steps of fabricating the piezoelectric vibrator according to the first embodiment of the invention.

Next, as a finely adjusting step S33, the piezoelectric vibrating piece 2 is finely adjusted. That is, as shown by FIG. 20, in a vacuum atmosphere, by bringing electrodes into contact with the outer peripheral face of the main body portion 12b of the ring 12 and a contact 39 provided at the pallet 38 and applying a voltage therebetween, the vibrating arm portions 5 and 6 of the piezoelectric vibrating piece 2 are vibrated. Further, fine adjustment is carried out such that vibration of the vibrating arm portions 5 and 6 of the piezoelectric vibrating piece 2 is made to constitute a predetermined resonance frequency by measuring the frequency of the vibrating arm portions 5 and 6 while evaporating a metal film forming the finely adjusting portion 10 by irradiating a laser beam to the finely adjusting portion 10.

Figure 21:
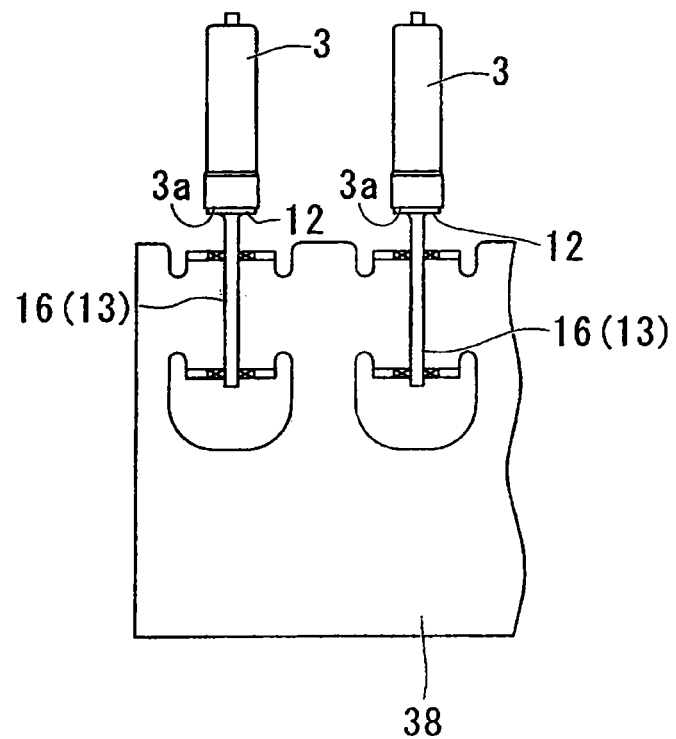
FIG. 21 is an explanatory view showing a press-fitting step in steps of fabricating the piezoelectric vibrator according to the first embodiment of the invention.
Figure 22:
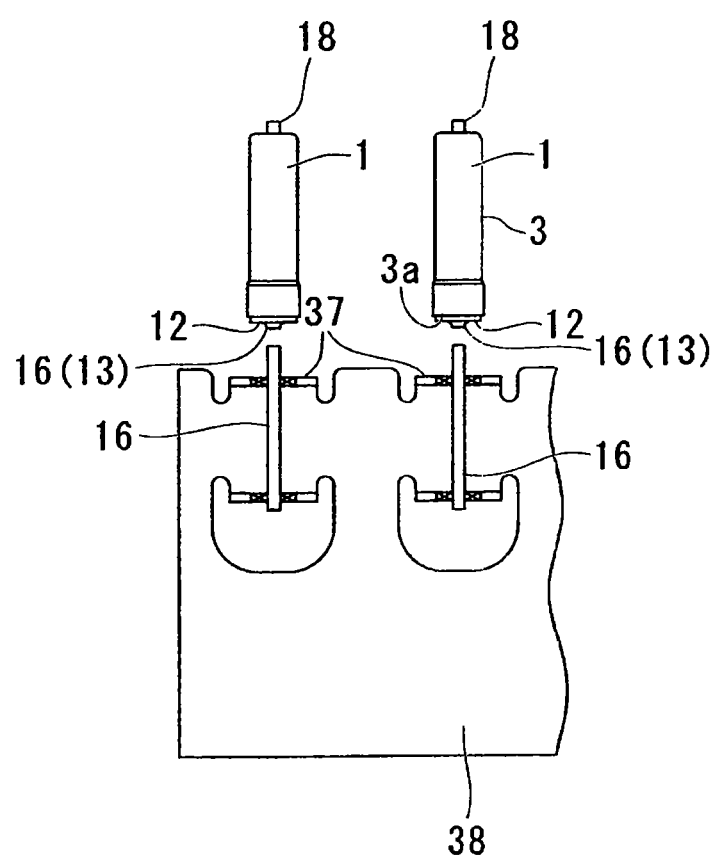
FIG. 22 is an explanatory view showing a cut separating step in steps of fabricating the piezoelectric vibrator according to the first embodiment of the invention.

Next, as a press-fitting step S34, as shown by FIG. 21, in a vacuum atmosphere, by inserting each piezoelectric vibrating piece 2 from the opening portion 3a of the case 3 previously formed by a predetermined shape and press-fitting the ring 12 of the airtight terminal 4 of the case 3, the piezoelectric vibrating piece 2 is brought into a state of being sealed in airtight at inside of the case 3. Finally, as a cut separating step S35, as shown by FIG. 22, by cutting a portion of the first outer lead portion 16 of the lead 13 fitted to the airtight terminal arranging portion 37 of the pallet 38, the piezoelectric vibrator 1 is finished.

As described above, according to the piezoelectric vibrator 1 of the embodiment, with regard to the first exciting electrode 8 and the second exciting electrode 9 of the piezoelectric vibrating piece 2 arranged at inside of the case 3, the first exciting electrode 8 can be conducted from outside by the first outer lead portion 16 of the lead 13 and the second exciting electrode 9 can be conducted from outside by the second outer lead portion 18 of the case 3 respectively by way of the ring 12 and the case 3 without being shortcircuited to each other. Here, the second exciting electrode 9 and the wire connecting portion 12*b* are connected by bonding these by arranging the wire 17 therebetween, and therefore, outer diameters of the case 3 and the ring 12 are not enlarged, further, it is not necessary to constitute the ring 12 by a complicated shape. Therefore, according to the piezoelectric vibrator 1 of the embodiment, small-sized formation is achieved while preventing shortcircuit and the piezoelectric vibrator 1 can be fabricated easily and with excellent yield. Particularly, by constituting the position of the ring 12 connected with the wire 17 by the wire connecting portion 12*b* projected to the inner peripheral side, a range of arranging the wire 17 can be made to be smaller than the outer diameter of the ring 12, and further small-sized formation can be achieved.

Further, by constituting the wire connecting portion 12*b* by the inner flange projected from the main body portion 12*a* of the ring 12 to the inner peripheral side over an entire periphery thereof, even when the outer diameter of the ring 12 is reduced, in the ring forming step, the wire connecting portion 12*b* can easily be formed by pressing. Further, the piezoelectric vibrating piece 2 can be arranged at the position substantially equal to the center axis L3 of the case 3 along with the lead 13 by being arranged at the position substantially equal to the center axis of the lead 13 by the bump connecting portion 15*a* formed substantially by the flat face. Therefore, an inner peripheral face of the case 3 and the piezoelectric vibrating piece 2 can be set to separate by a minimum size in accordance with the range of displacing the piezoelectric vibrating piece 2, and therefore, small-sized formation of the case 3 and the ring 12 can further be achieved.

Second Embodiment

FIG. 23 through FIG. 43 show a second embodiment according to the invention.

A point of a difference between the second embodiment and the first embodiment resides in that the method of connecting the wire 17 and the ring 12 differs. That is, although according to the first embodiment, the wire 17 is connected to the wire connecting portion 12*b* constituting the inner flange formed to project to the inner peripheral side over the entire periphery of the main body portion 12*a* constituting the ring 12, according to the second embodiment, a ring 112 having a diameter contracted portion 112*b* in which an outer diameter thereof is previously formed to be smaller than that of a press-fitting portion 112*a* press-fitted to a case 103 is used and a wire 117 is connected to a flat step portion 112*e* formed at the diameter contracted portion 112*b*.

Figure 23:
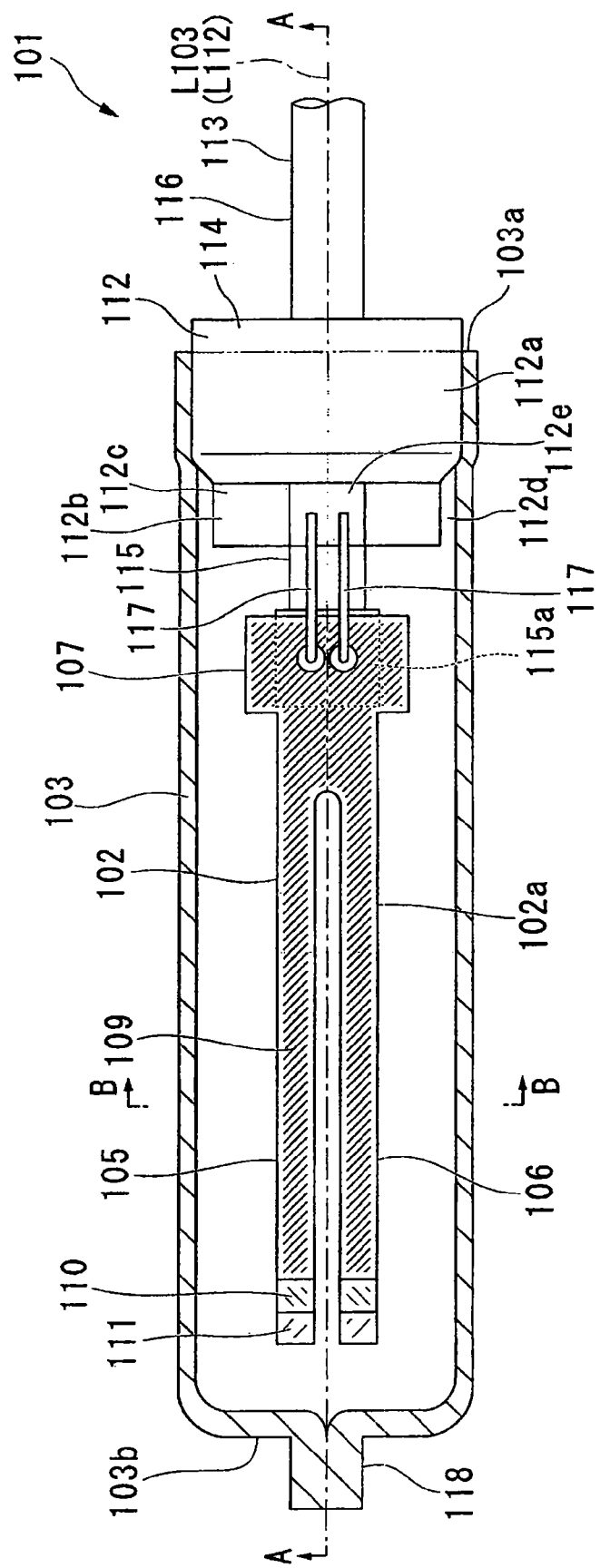
FIG. 23 is a top view of a piezoelectric vibrator according to a second embodiment of the invention.

Further, according to the embodiment, an explanation will be given by attaching newly a notation even to a constituent element the same as that of the first embodiment. FIG. 23 shows a total view of a piezoelectric vibrator according to the embodiment. Further, FIG. 24 shows a sectional view taken along a cut line A-A of FIG. 23 and FIG. 25 shows a sectional view taken along a cut line B-B thereof.

Figure 24:
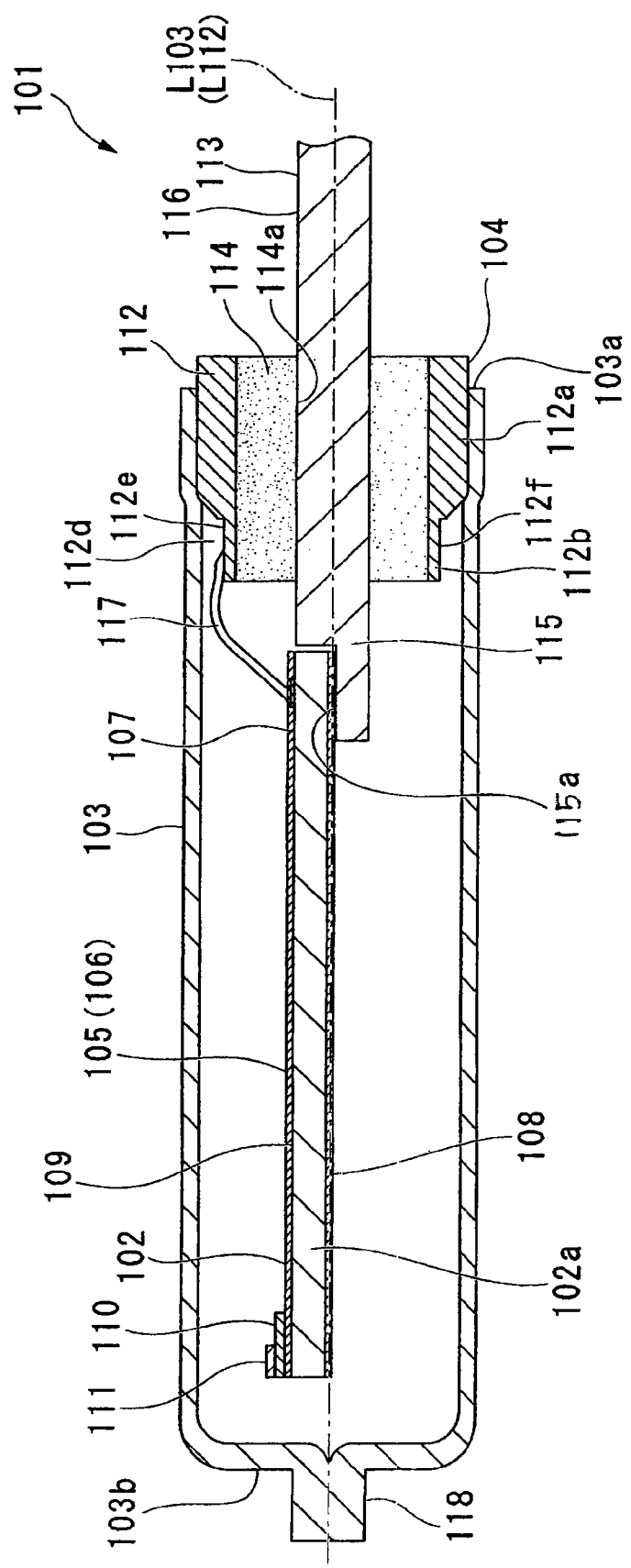
FIG. 24 is a sectional view taken along a cut line A-A shown in FIG. 23 of the piezoelectric vibrator according to the second embodiment of the invention.
Figure 25:
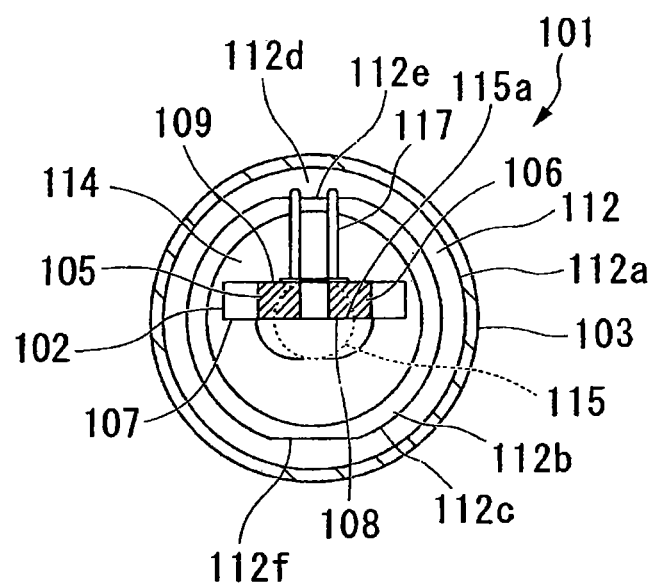
FIG. 25 is a sectional view taken along a cut line B-B shown in FIG. 23 of the piezoelectric vibrator according to the second embodiment of the invention.
Figure 27:
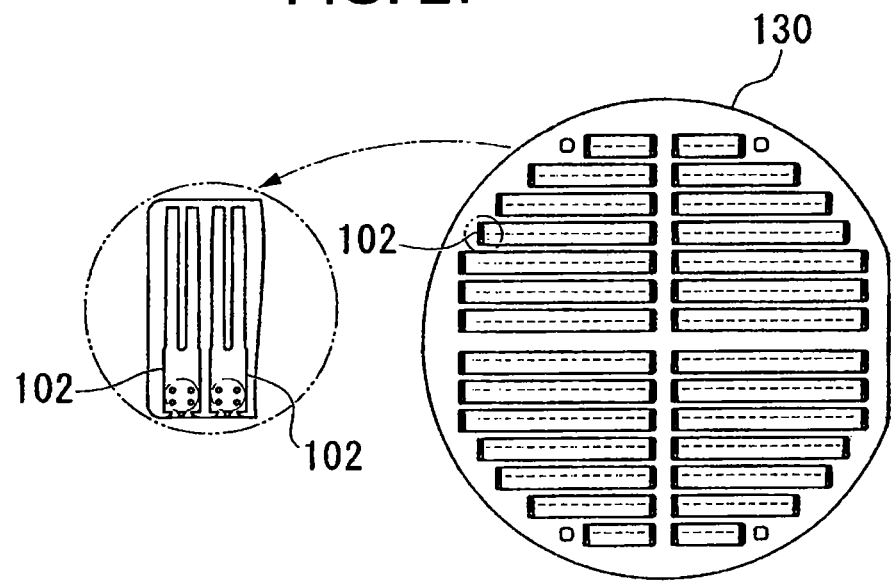
FIG. 27 is an explanatory view showing a piezoelectric vibrator fabricating step in steps of fabricating the piezoelectric vibrator according to the second embodiment of the invention.

As shown by FIG. 23 through FIG. 25, a piezoelectric vibrator 101 of the embodiment is a cylinder package type piezoelectric vibrator, including a piezoelectric vibrating piece 102, a case 103 substantially in a shape of a bottomed cylinder arranged with the piezoelectric vibrating piece 102 at inside thereof for covering an outer periphery thereof, and an airtight terminal 104 for sealing an opening portion 103*a* of the case 103 in airtight. In the case of the embodiment, the piezoelectric vibrating piece 102 is a vibrating piece of a tuning fork type and is formed by a pair of vibrating arm portions 105, 106 arranged in parallel with each other in a state of being contiguous to each other, and a substantially plate-shaped quartz piece 102*a* having a base portion 107 for integrally fixing base end sides of the vibrating arm portions 105, 106.

Both faces of the quartz piece 102*a* are respectively provided with a first exciting electrode 108 and a second exciting electrode 109 formed with conductive films of chromium (Cr), nickel (Ni), aluminum (Al), titanium (Ti) or the like by a predetermined pattern. The first exciting electrode 108 and the second exciting electrode 109 are electrically separated each other to be subjected to patterning. Further, by applying a voltage to respectives of the first exciting electrode 108 and the second exciting electrode 109, the vibrating arm portions 105, 106 can be vibrated by a predetermined resonance frequency in a direction of being proximate to each other or remote from each other. Further, at front end sides of the vibrating arm portions 105, 106, at least one of the first exciting electrode 108 or the second exciting electrode 109 is provided with a finely adjusting portion 110 and a roughly adjusting portion 111 formed by a chromium (Cr) film or the like and the vibrating arm portions 105, 106 are set to a predetermined resonance frequency by irradiating a laser beam or the like to machine the finely adjusting portion 110 and the roughly adjusting portion 111.

The airtight terminal 104 includes a ring 112 substantially in a cylindrical shape press-fitted to the opening portion 103*a* of the case 103, 1 piece of a lead 113 inserted into the ring 112, and a filling member 114 formed between the ring 112 and the lead 113 at inside of the ring 112 to seal in airtight. The filling member 114 is formed by a material having an insulating property and is a glass ring formed by borosilicate glass having a through hole 114*a* according to the embodiment for insulating the ring 112 and the lead 113 and sealing inside of the case 103 in airtight by inserting the lead 113 into the through hole 114*a* to sinter in a state of being inserted to inside of the ring 112.

The lead 113 is arranged to be coaxial with a center axis L103 of the case 103 and a center axis L112 of the ring 112, including the inner lead portion 115 projected from the ring 112 to a side of an inner portion of the case 103 and a first outer lead portion 116 projected from the ring 112 to a side of an outer portion of the case 103. A front end side of the inner lead portion 115 is provided with a bump connecting portion 115*a* formed substantially by a flat face. The bump connecting portion 115*a* is formed by pressing to crush a portion of the lead 113 to constitute substantially a flat face up to a vicinity of the center axis L103. Further, the first exciting electrode 108 of the piezoelectric vibrating piece 102 is subjected to bump connection with the bump connecting portion 115*a* of the base portion 107, thereby, the first exciting electrode 108 and the lead 113 are brought into an electrically connected state and the piezoelectric vibrating piece 102 is brought into a state of being supported by the inner lead portion 115 of the lead 113 in a cantilever state.

The ring 112 includes the press-fitting portion 112*a* substantially in a cylindrical shape and the diameter contracted portion 112*b* extended from the press-fitting portion 112*a* to an inner portion of the case 103. The press-fitting portion 112*a* is press-fitted to the case 103 by setting an outer diameter thereof to be substantially equal to an inner diameter of the case 103. Further, a diameter of the diameter contracted portion 112b is more contracted than that of the press-fitting portion 112a and arranged by providing a gap 112d between the diameter contracted portion 112b and an inner peripheral face of the case 103. Further, portions of an outer peripheral face 112c of the diameter contracted portion 112b are provided with two step portions 112e, 112f substantially formed by flat faces. The step portions 112e, 112f are formed substantially symmetrical with each other relative to the center axis L112 of the ring 112 and substantially in parallel with the both faces of the piezoelectric vibrating piece 102 formed with the first exciting electrode 108 and the second exciting electrode 109.

Further, the ring 112 is formed by a conductive material, preferably, a material having a thermal expansion coefficient to a degree the same as that of glass forming the filling member 114, for example, iron nickel cobalt alloy, iron nickel alloy or the like is selected therefor. Further, the step portion 112e selected from the step portions 112e, 112f of the ring 112 and disposed on a side of the second exciting electrode 109 of the piezoelectric vibrating piece 102 and the second exciting electrode 109 of the piezoelectric vibrating piece 102 are subjected to wire bonding by the wire 117 to be connected electrically. Further, according to the embodiment, 2 pieces of the wires 117 are provided.

The case 103 is formed by a conductive material, including the opening portion 103a on one end side and including a bottom portion 103b on other end side. Further, by press-fitting the ring 112 of the airtight terminal 104 to the opening portion 103a, inside thereof is brought into a vacuum state to be sealed in airtight. Further, the bottom portion 103b is formed with a second outer lead portion 118 projected to outside. Therefore, according to the piezoelectric vibrator 101 of the embodiment, by the first outer lead portion 116, the first exciting electrode 108 of the piezoelectric vibrating piece 102 is made to be able to be conducted from outside of the case 103 by way of the lead 113 and by the second outer lead portion 118, the second exciting electrode 109 of the piezoelectric vibrating piece 102 is made to be able to be conducted from outside of the case 103 by way of the case 103, the ring 112 and the wire 117.

Further, a portion of the ring 112 of the airtight terminal 104 bonded with the wire 117 of the step portion 112e and the bump connecting portion 115a of the lead 113 are applied with gold plating, not illustrated, respectively partially to improve conduction. As such gold plating, a film is formed by a film thickness of about several thousands Å at the step portion 112e and the bump connecting portion 115a. Next, a method of fabricating the piezoelectric vibrating piece 101 will be explained.

Figure 26:
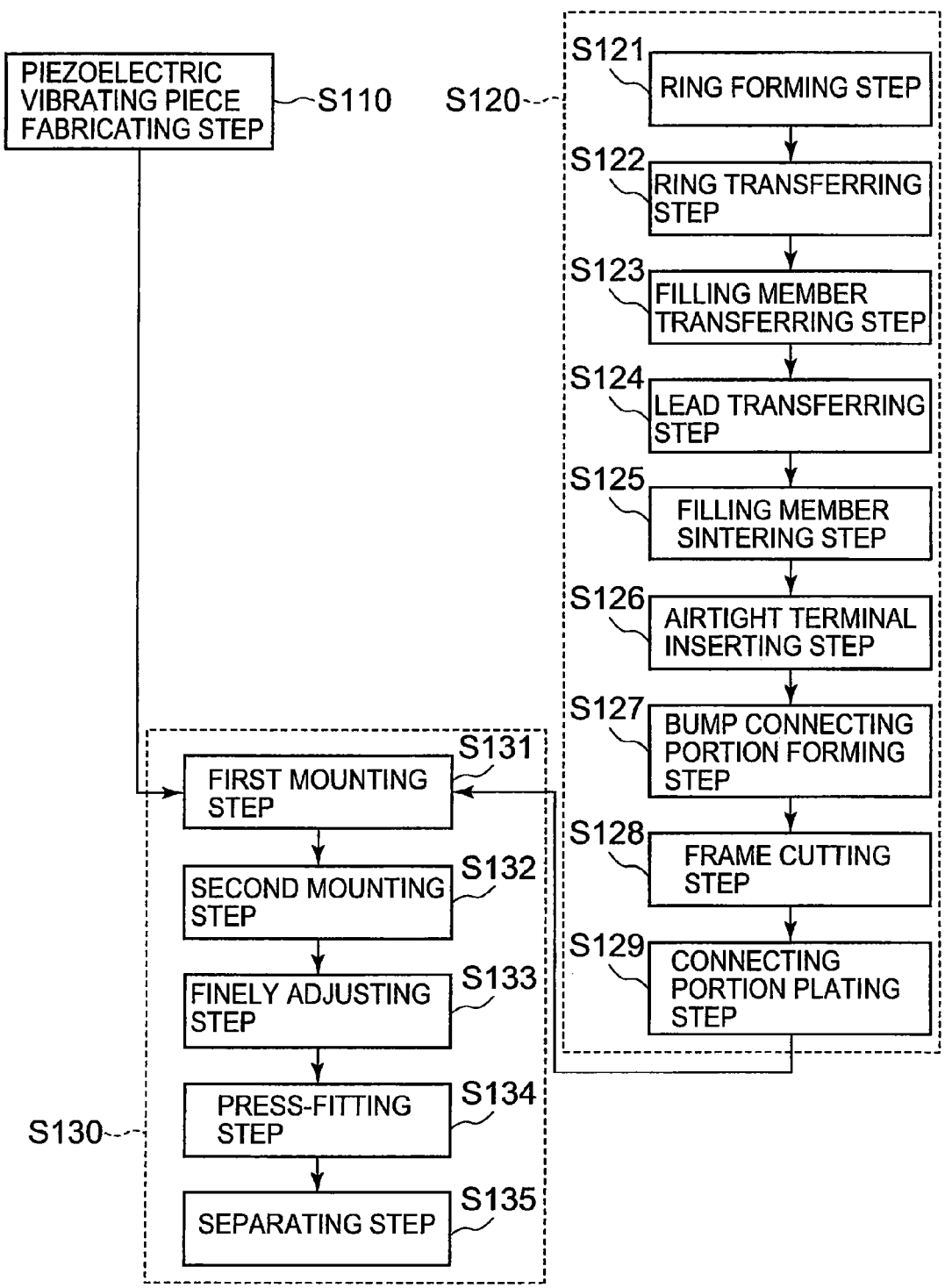
FIG. 26 is a flowchart showing steps of fabricating the piezoelectric vibrator according to the second embodiment of the invention.

FIG. 26 shows a flowchart of steps of fabricating the piezoelectric vibrator 101 according to the embodiment, and FIG. 27 through FIG. 43 show explanatory views of respective fabricating steps. Steps of fabricating the piezoelectric vibrator 101 of the embodiment are grossly classified into a piezoelectric vibrating piece fabricating step S110 for fabricating a piezoelectric vibrating piece, an airtight terminal fabricating step S120 for fabricating the airtight terminal 104, and an integrating step S130 of integrating the piezoelectric vibrating piece 102, the airtight terminal 104, and the case 103. Respective details thereof will be explained as follows.

At a piezoelectric vibrating piece fabricating step S110, first, a wafer having a predetermined thickness is fabricated by slicing Lambert raw stone of quartz, further, the wafer is polished to constitute a constant thickness. Further, a plurality of the quartz pieces 102a can be fabricated from the wafer by patterning and etching an outer shape of the quartz piece 102a to the wafer by a photolithography technology. Next, the fabricated each quartz piece 102a is formed with metal films of constituting the first exciting electrode 108, the second exciting electrode 109, the finely adjusting portion 110, the roughly adjusting portion 111 and the like. Further, a weight of each quartz piece 102a is changed by evaporating a portion of the metal film forming the roughly adjusting portion 111 by irradiating laser beam to the roughly adjusting portion 111, thereby, a resonance frequency of the quartz piece 102a is roughly adjusted to finish the piezoelectric vibrating piece 102. Further, fine adjustment of adjusting the resonance frequency of the quartz piece 102a further highly accurately is carried out after integrating the airtight terminal 104 thereto. Further, as shown by FIG. 4, a plurality of the piezoelectric vibrating pieces 102 fabricated in this way are aligned on an exclusive pallet 130 and carried to an integrating step S130 mentioned later.

Figure 28A:
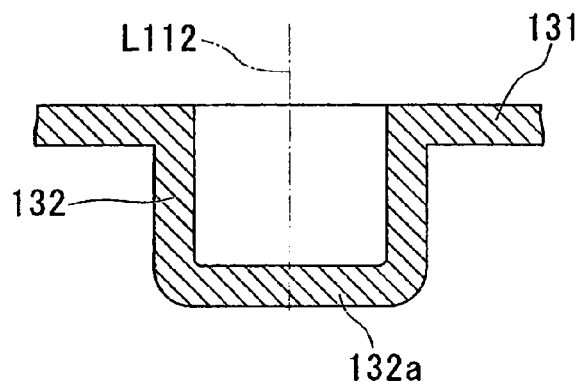
FIGS. 28A, 28B, 28C and 28D are explanatory views showing a ring forming step in steps of fabricating the piezoelectric vibrator according to the second embodiment of the invention.

Next, an airtight terminal fabricating step S120 will be explained. At the airtight terminal fabricating step S120, first, as a ring forming step S121, the ring 112 is fabricated. That is, as shown by FIG. 28A, by subjecting a plate member 131 having a conductivity of iron nickel cobalt alloy, iron nickel alloy or the like forming the ring 112 to lancing, thereafter, subjecting the plate member 131 to deep drawing by a plurality of times, a bottomed cylinder member 132 having an outer diameter substantially equal to that of the press-fitting portion 112a of the ring 112 is formed. Further, a fabricating position of forming the cylinder member 132 is positioned accurately by a pilot hole, not illustrated, previously formed at the plate member 131, thereby, a plurality of the cylinder members 132 can be aligned to be formed.

Figure 28B:
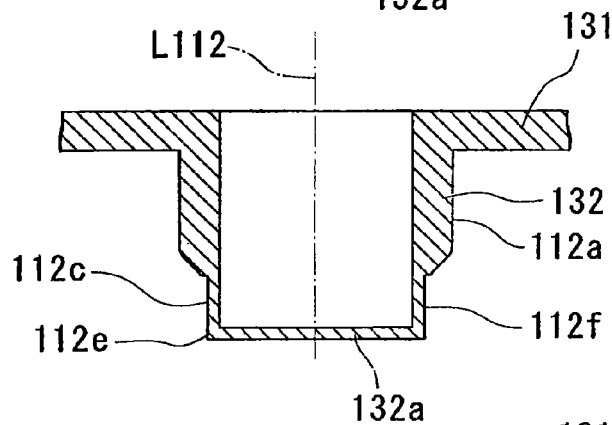
Figure 28C:
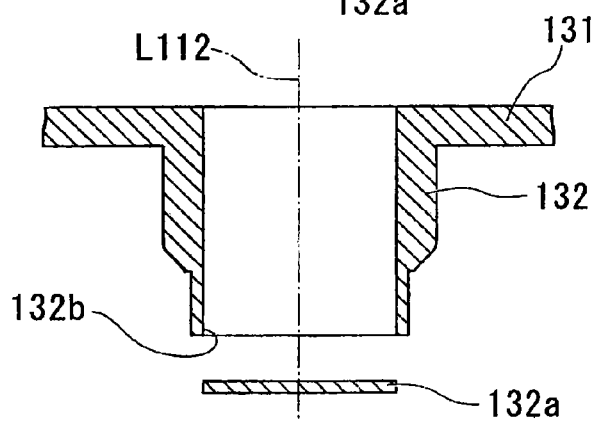
Figure 28D:
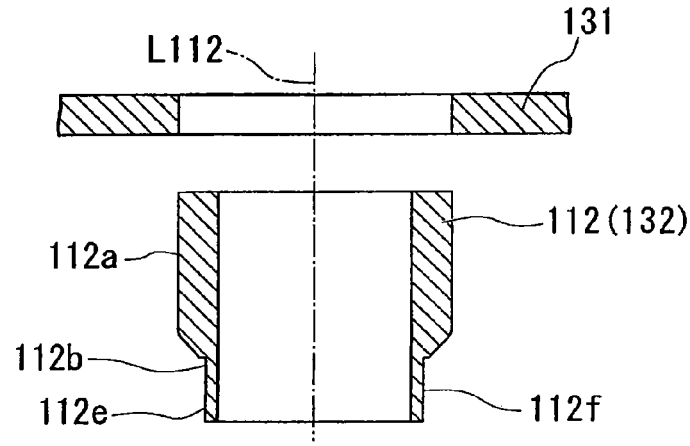

Next, as shown by FIG. 28B, sizing is carried out to form the diameter contracted portion 112b and the step portions 112e, 112f. That is, portions of the cylinder member 132 for constituting the diameter contracted portion 112b is further compressed to contract an outer diameter thereof and portions thereof for constituting the step portions 112e, 112f are worked by a die to constitute flat faces. Here, by forming the step portions 112e and 112f substantially symmetrically relative to the center axis L112, the diameter contracted portion 112b can substantially be formed by a uniform cylindrical shape without being deformed as a whole. Successively, as shown by FIG. 28C, a ceiling hole 132b is punched at a bottom portion 132a of each cylindrical member 132. Finally, as shown by FIG. 28D, by drawing an outer shape thereof, the cylindrical member 132 is separated from the plate member 131 to thereby finish the ring 112.

Figure 29:
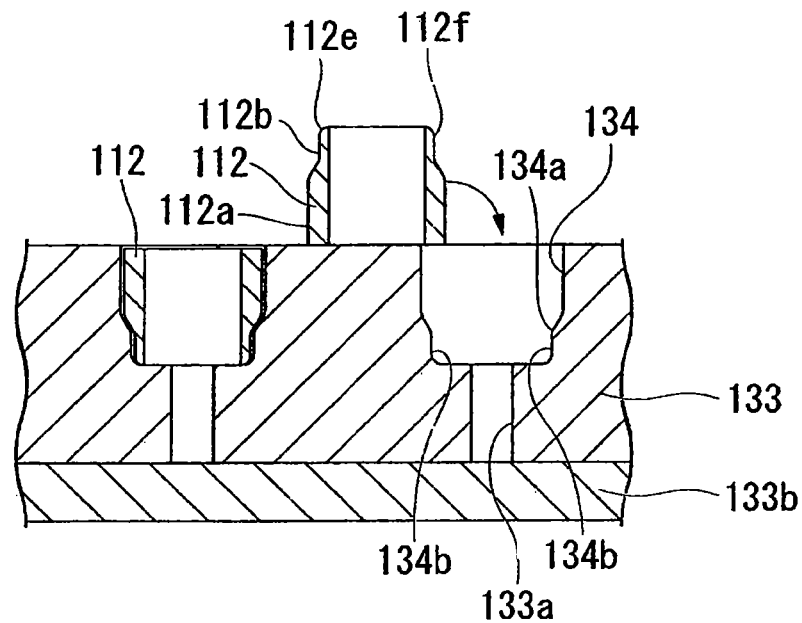
FIG. 29 is an explanatory view showing a ring transferring step in steps of fabricating the piezoelectric vibrator according to the second embodiment of the invention.

Next, the ring 112, the lead 113 and the filling member 114 are integrated. That is, first, as a ring transferring step S122, as shown by FIG. 29, a plurality of the rings 112 are charged to a carbon jig for ring 133 having a plurality of recess portions 134. Further in details, the carbon jig for ring 133 is formed by carbon to be able to be used in sintering the filling member 114 at a filling member sintering step S125 mentioned later. Further, the recess portion 134 is formed with a diameter contracted portion 134a in correspondence with the diameter contracted portion 112b of the ring 112 on a bottom side thereof and flat portions 134b in correspondence with the step portions 112e and 112f of the ring 112. Directions of the respective flat portions 134b of a plurality of recess portions 134 are formed to be substantially equal to each other.

Further, a bottom face of the recess portion 134 is formed with an inserting hole 133a capable of inserting the lead 113 coaxially with the recess portion 134. A depth of the inserting hole 133a corresponds to a length of the inner lead portion 115 of the lead 113 and is closed by a bottom plate 133b.

Further, by mounting the plurality of rings 112 at an upper face of the carbon jig for ring 133 and vibrating the carbon jig for ring 133, the plurality of rings 112 are charged respectively by being directed to the recess portions 134 substantially equally. At this occasion, the ring 112 can smoothly be charged by vibration by forming the two step portions 112e and 112f substantially symmetrically relative to the center axis L112 and forming the ring 112 as the substantially symmetrical member as a whole.

Figure 30:
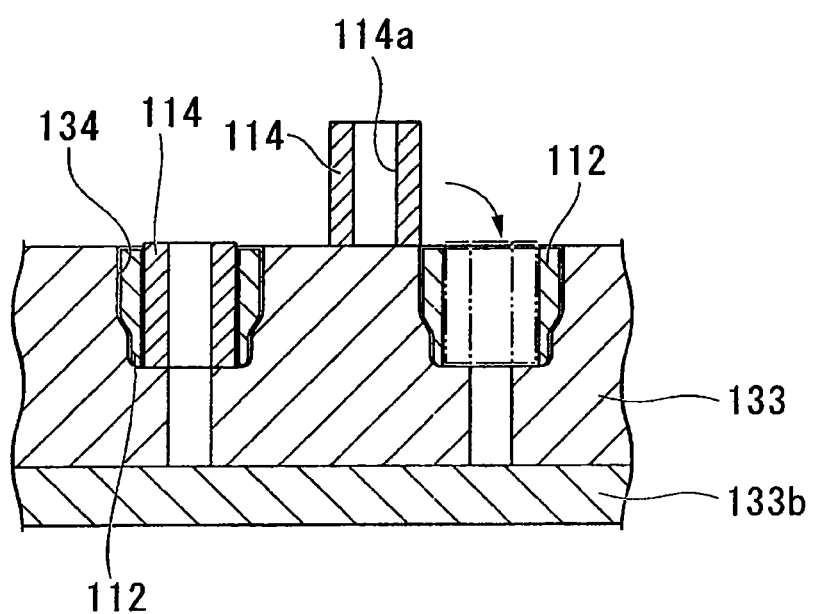
FIG. 30 is an explanatory view showing a filling member transferring step in steps of fabricating the piezoelectric vibrator according to the second embodiment of the invention.

Next, as a filling member transferring step S123, as shown by FIG. 30, the filling member 114 is inserted to inside of each ring 112 charged to the recess portion 134 of the carbon jig for ring 133. The filling member 114 is provided with an outer diameter capable of being inserted to inside of the ring 112 and is constituted by a shape having a through hole 114a capable of inserting the lead 113 as a shape before being sintered by a filling member sintering step S125 mentioned later. Further by mounting the plurality of filling members 114 at an upper face of the carbon jig for ring 133 and vibrating the carbon jig for ring 133, the respective filling members 114 are inserted to insides of the rings 112.

Figure 31:
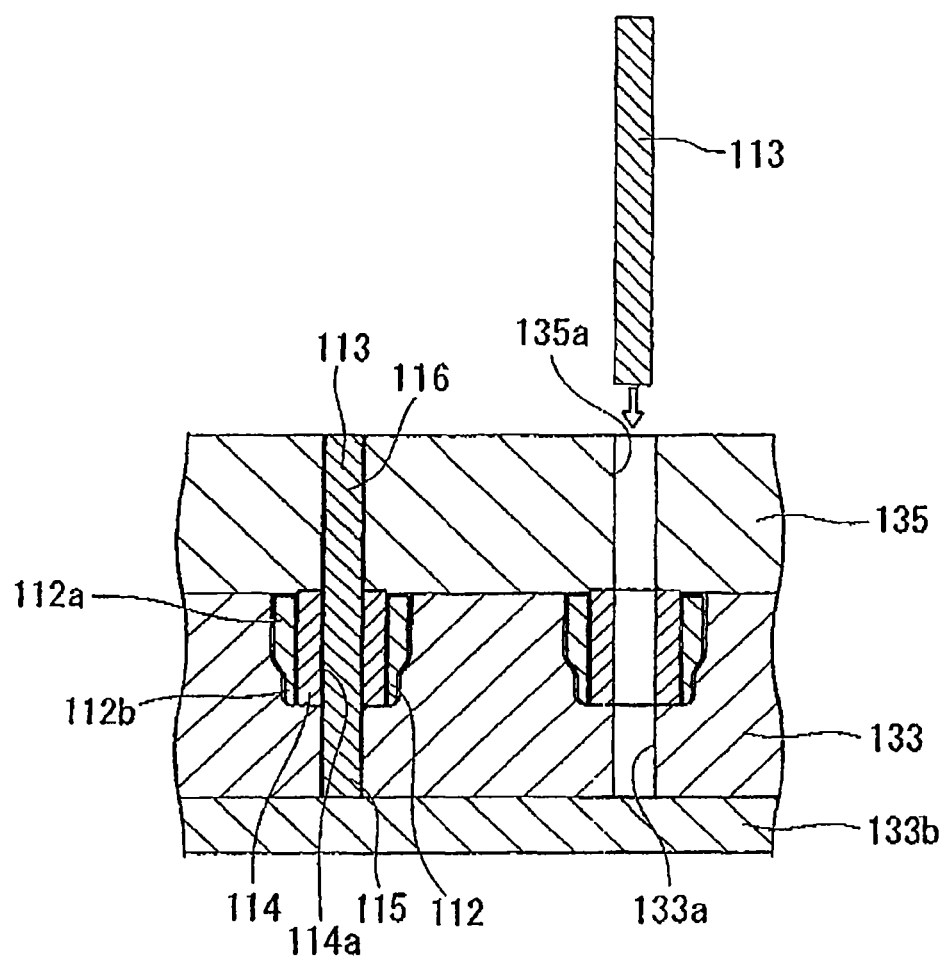
FIG. 31 is an explanatory view showing a lead transferring step in steps of fabricating the piezoelectric vibrator according to the second embodiment of the invention.

Next, as a lead transferring step S124, as shown by FIG. 31, the lead 113 is inserted to the through hole 114a of the filling member 114 inserted to inside of each ring 112. First, a carbon jig for lead 135 is mounted at an upper face of the jig for ring 133 charged with the ring 112 and the filling member 114. The carbon jig for lead 135 is formed with a plurality of through holes 135a capable of inserting the leads 113. Further, the carbon jig for ring 133 and the carbon jig for lead 135 are provided with a positioning pin and a positioning hole, not illustrated, in correspondence with each other, thereby, the recess portion 134 and the through hole 135a are coaxially arranged in a state of being integrated to each other. Further, by mounting the plurality of leads 113 at an upper face of the carbon jig for lead 135 and vibrating the carbon jig for ring 133 and the carbon jig for lead 135, each lead 113 is inserted to the through hole 114a of the filling member 114 inserted to the ring 112 and is integrated with the ring 112 and the filling member 114 in a state of projecting the inner lead portion 115 to a lower side of the ring 112 and projecting the first outer lead portion 116 to an upper side of the ring 112.

Figure 32:
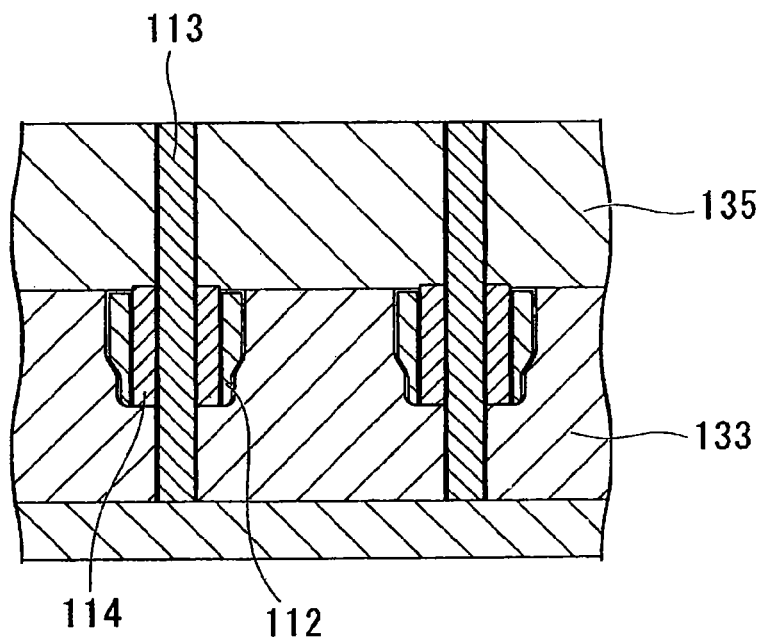
FIG. 32 is an explanatory view showing a filling member sintering step in steps of fabricating the piezoelectric vibrator according to the second embodiment of the invention.
Figure 33:
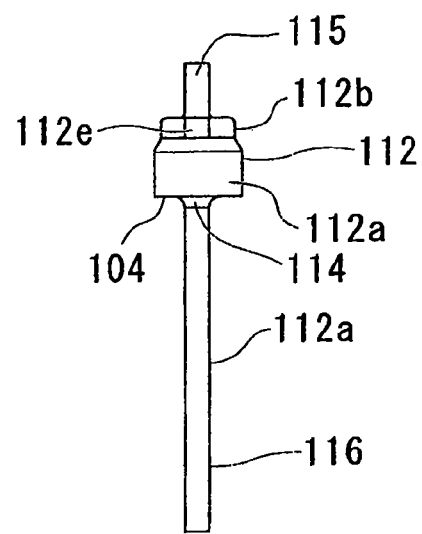
FIG. 33 is an outline view showing an airtight terminal fabricated by an airtight terminal fabricating step in steps of fabricating the piezoelectric vibrator according to the second embodiment of the invention.

Next, as the filling member sintering step S125, the filling member 114 is sintered in a state of being integrated to the ring 112 and the lead 113. That is, as shown by FIG. 32, the carbon jig for ring 133 and the carbon jig for lead 135 are arranged at inside of a heating furnace and heated at a predetermined temperature in a state of being charged with the ring 112, the lead 113 and the filling member 114 at insides thereof. Thereby, the filling member 114 is sintered to seal intervals between the filling member 114 and respectives of the ring 112 and the lead 113 in airtight, further, the ring 112, the lead 113 and the filling member 114 are integrated, and as shown by FIG. 33, the airtight terminal 104 is formed. Further, the bump connecting portion 115a of the inner lead portion 115 of the lead 113 is formed by a bump connecting portion forming step S127 mentioned later.

Next, as an airtight terminal inserting step S126, the airtight terminal 104 is removed from the carbon jig for ring 133 and the carbon jig for lead 135 and aligned to a unit frame 136. FIGS. 34A and 34B show a unit frame 136 before aligning the airtight terminal 104 and FIGS. 35A and 35B shows the unit frame 136 after aligning the airtight terminal 104. The unit frame 136 is a member continuous in a strip-like shape and arranged with a plurality of airtight terminal arranging portions 137 at equal intervals in a longitudinal direction although illustration thereof is omitted in FIGS. 34A and 34B. The airtight terminal arranging portion 137 is constituted by a pair of fitting portions 137a, 137b capable of fitting the first outer lead portions 116 of the leads 113 at the respective airtight terminals 104. Further, as shown by FIGS. 35A and 35B, each airtight terminal 104 formed by the above-described step is arranged to each airtight terminal arranging portion 137 of the unit frame 136 by fitting the first outer lead portion 116 to the pair of fitting portions 137a and 137b to direct either of the step portions 112e and 112f of the ring 112 to an upper side.

Here, at the airtight terminal 104, the step portions 112e, 112f of the ring 112 are formed substantially symmetrically with each other relative to the center axis L112. Therefore, even when either of the step portions 112e and 112f is selected to be arranged to direct to the upper side, wire bonding can be carried out by a condition the same as that of a second mounting step S132 mentioned later. That is, by providing a plurality of the step portions, in arranging the airtight terminal 104, either of the step portions constituting a position of carrying out wire bonding at a later stage can easily be adjusted in an upper direction.

Figure 36A:
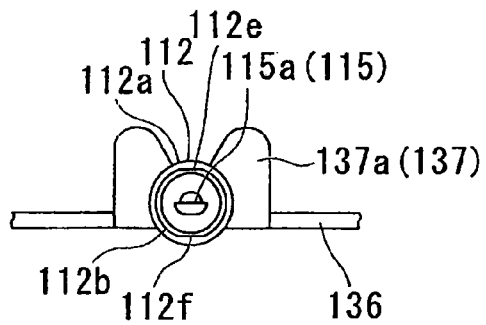
FIGS. 36A and 36B are explanatory views showing a bump connecting portion forming step in steps of fabricating the piezoelectric vibrator according to the second embodiment of the invention.
Figure 36B:
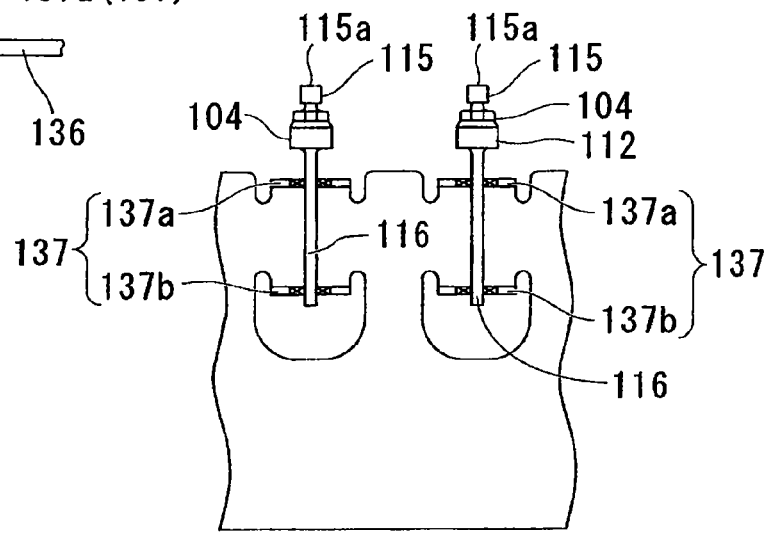

Next, as the bump connecting portion forming step S127, the bump connecting portion 115a is formed at the inner lead portion 115 of each airtight terminal 104. That is, as shown by FIGS. 36A and 36B, while moving the unit frame 136, front end portions of the inner lead portions 115 of the respective airtight terminals 104 projected from the unit frame 136 are pressed to crush from above. Here, by carrying out the bump connecting portion forming step S127 after the filling member sintering step S125 as in the embodiment, it is not necessary to adjust directions of the step portions 112e and 112f of the ring 112 and the bump connecting portion 115a of the lead 113 relative to each other at the lead transferring step S124 and the filling member sintering step S125 mentioned above. Further, when the bump connecting portion 115a is formed at the bump connecting portion forming step S127, since the lead 113 is integrated with the ring 112, the bump connecting portion 115a can be formed by easily and accurately adjusting directions of the ring 112 and the step portion 112e and 112f relative to each other.

Figure 37:
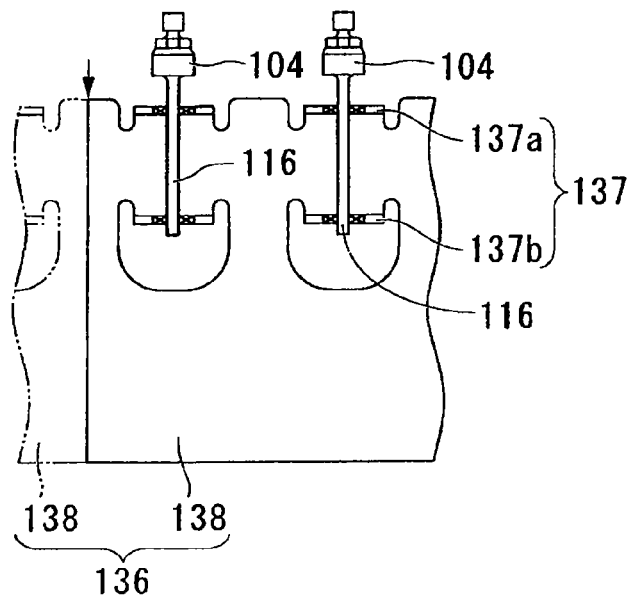
FIG. 37 is an explanatory view showing a frame cutting step in steps of fabricating the piezoelectric vibrator according to the second embodiment of the invention.

Next, as a frame cutting step S128, as shown by FIG. 37, the unit frame 136 in the strip-like shape is cut at each predetermined length. Hereinafter, the unit frame after having been cut is referred to as a pallet 138.

Figure 38:
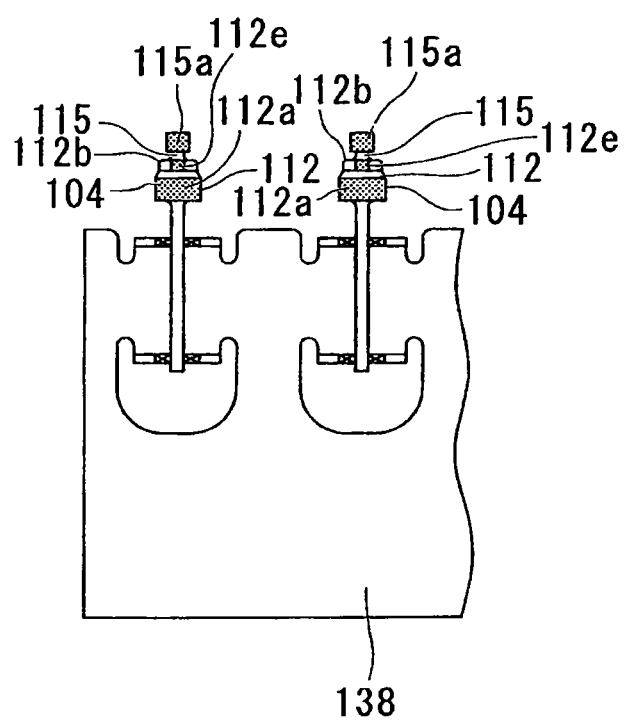
FIG. 38 is an explanatory view showing a plating step in steps of fabricating the piezoelectric vibrator according to the second embodiment of the invention.

Next, as the plating step S129, as shown by FIG. 38, at each pallet 138, gold plating is applied to an outer peripheral face of the press-fitting portion 112a and a portion of the step portion 112e of the ring 112 of each airtight terminal 104 as well as the bump connecting portion 115a of the lead 113.

As plating, substrate plating and finish plating are applied. As substrate plating, for example, copper plating is applied. As finish plating of the outer peripheral face of the press-fitting portion 112a of the ring 112, for example, tin copper alloy plating is carried out by a film thickness of about several μm through ten μm to maintain airtightness by press-fitting the ring 112 to the case 103. Gold plating is applied as finish plating of the step portion 112a and the bump connecting portion 115a.

Gold plating at the step portion 112e is for carrying out wire bonding mentioned later, and gold plating at the bump connecting portion 115a of the lead 113 is for bump connection with the first exciting electrode 108 of the piezoelectric vibrating piece 102 mentioned later. Gold plating of the step portion 112e and the bump connecting portion 115a is formed by a film thickness of, for example, about several thousands Å.

Further, tin copper alloy plating may be applied to the step portion 112e and the bump connecting portion 115a and gold plating may be applied further thereon. Further, gold plating may be applied further on a surface of tin copper alloy plating of the press-fitting portion 112a of the ring 112.

Thereby, all the steps of the airtight terminal fabricating step S120 are finished.

Figure 39A:
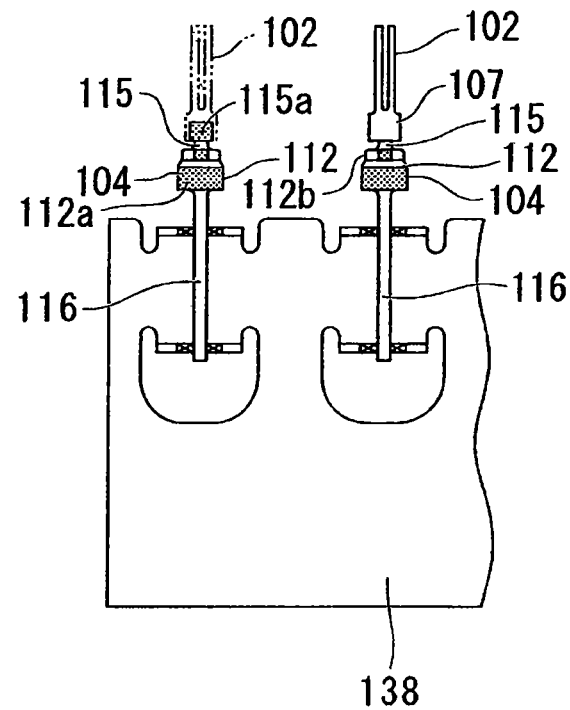
FIGS. 39A and 39B are explanatory views showing a first mounting step in steps of fabricating the piezoelectric vibrator according to the second embodiment of the invention.
Figure 39B:
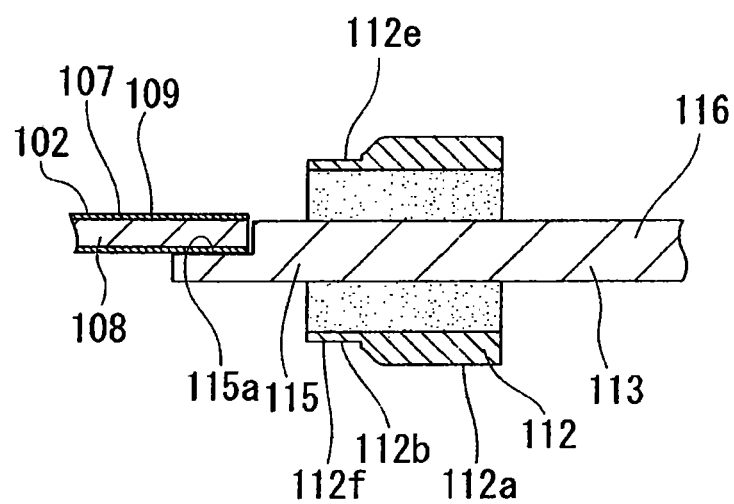

Next, as the integrating step S130, the piezoelectric vibrating piece 102, the case 103 and the airtight terminal 104 are integrated. First, as a first mounting step S131, as shown by FIGS. 39A and 39B, the piezoelectric vibrating piece 102 is mounted to the inner lead portion 115 of each airtight terminal 104. That is, the piezoelectric vibrating piece 102 fabricated by the piezoelectric vibrating piece fabricating step S110 is taken out from above the exclusive pallet 130. Further, the first exciting electrode 108 of the taken-out piezoelectric vibrating piece 102 is subjected to bump connection with the bump connecting portion 115a subjected to gold plating at the inner lead portion 115 of each airtight terminal 104 by the base portion 107. As conditions of bump connection, for example, a mounting temperature is 130° C., a bonding load is 0.5 N, loading time is about $15 \times 10^{-3}$ second. Thereby, the first exciting electrode 108 of the piezoelectric vibrating piece 102 and the lead 113 is brought into an electrically connected state and the piezoelectric vibrating piece 102 is brought into a state of being supported in a cantilever state by the inner lead portion 115 of the lead 113.

Here, by forming a portion of the inner lead portion 115 of the lead 113 for connecting the piezoelectric vibrating piece 102 by bump connection substantially by a flat face as the bump connecting portion 115a, the first exciting electrode 108 and the lead 113 can further firmly be conducted and the piezoelectric vibrating piece 102 can be supported by the lead 113. Further, by pressing to crush to form the bump connecting portion 115a up to the positions substantially equal to the center axis of the lead 113, the piezoelectric vibrating piece 102 can be bonded to the lead 113 at a position substantially equal to the center axis of the lead 113.

Figure 40A:
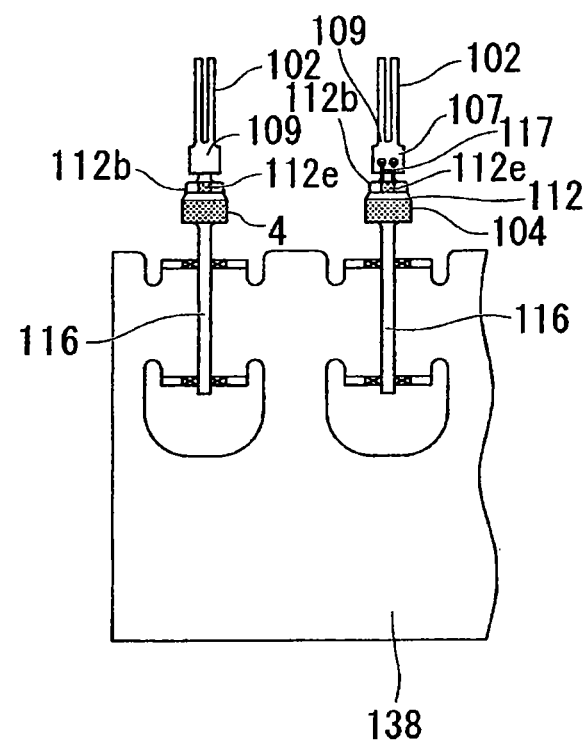
FIGS. 40A and 40B are explanatory views showing a second mounting step in steps of fabricating the piezoelectric vibrator according to the second embodiment of the invention.
Figure 40B:
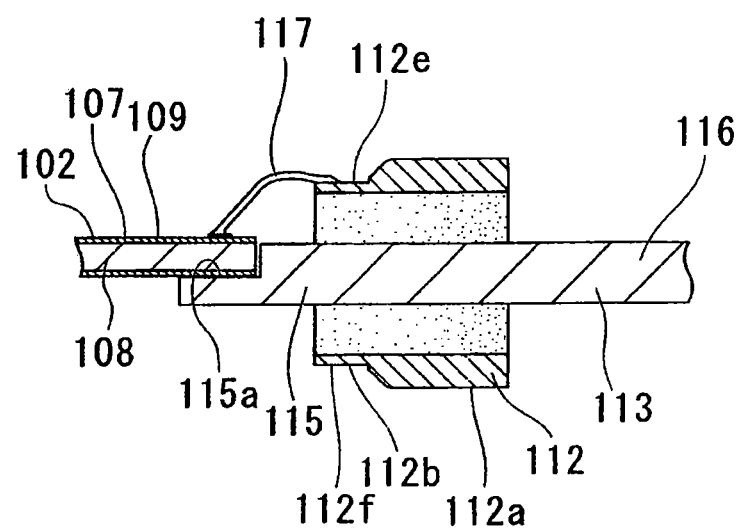

Next, as a second mounting step S132, as shown by FIGS. 40A and 40B, the step portion 112e selected from the step portions 112e and 112f of the ring 112 of each airtight terminal 104 and the second exciting electrode 109 of the piezoelectric vibrating piece 102 mounted to each airtight terminal 104 are subjected to wire bonding. According to the embodiment, 2 pieces of the wires 117 are bonded between the step portion 112e and the second exciting electrode 109. As the wire 117 used, for example, a gold (Au) wire is selected, one end of the wire 117 is bonded to the second exciting electrode 109 at the base portion 107 of the piezoelectric vibrating piece 102, thereafter, other end thereof is bonded to the step portion 112e of the ring 112. As respective conditions of wire bonding for example, the mounting temperature is 130° C., the wire diameter is 25 μm, the ball diameter is 80 through 85 μm, the ball thickness is 13 μm, the shear strength is 0.45 through 0.53 N, and when the wire is bonded to the second exciting electrode 109, a bonding load is 0.55 N, loading time is $7 \times 10^{-3}$ second, when the wire is bonded to the step portion 112e, the bonding load is 0.4 N, and loading time is about $5 \times 10^{-3}$ second.

Thereby, the second exciting electrode 109 of the piezoelectric vibrating piece 102 and the ring 112 are brought into an electrically connected state. Here, by bonding the wire to the step portion 112e substantially formed by the flat face in the outer peripheral face of the diameter contracted portion 112b, conduction can firmly be achieved. Particularly, by bonding these by the plurality of wires 117, conduction can further firmly be achieved. Further, the lead 113 connected to the first exciting electrode 108 and the ring 112 connected to the second exciting electrode 109 are brought into an insulated state by interposing the insulating filling member 114 therebetween, thereby, the first exciting electrode 108 and the second exciting electrode 109 of the piezoelectric vibrating piece 102 can be brought into an insulating state to prevent shortcircuit.

Figure 41:
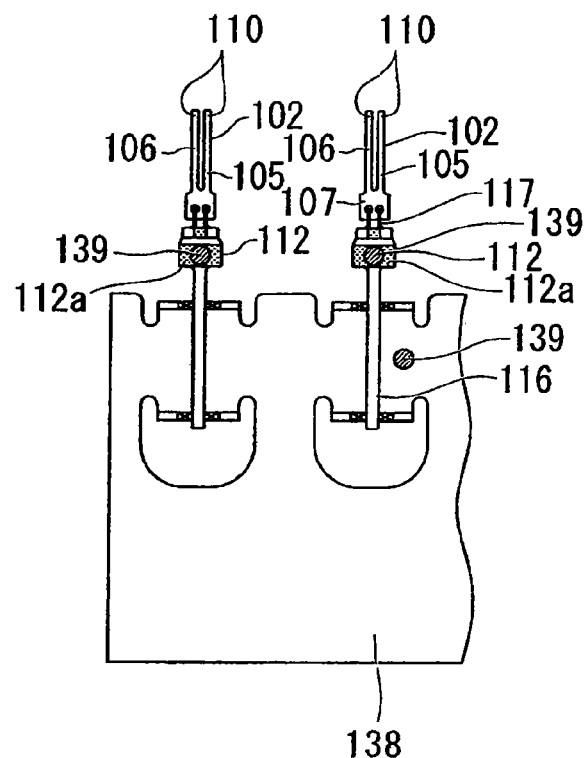
FIG. 41 is an explanatory view showing a finely adjusting step in steps of fabricating the piezoelectric vibrator according to the second embodiment of the invention.

Next, as a finely adjusting step S133, the piezoelectric vibrating piece 102 is finely adjusted. That is, as shown by FIG. 41, in a vacuum atmosphere, by bringing electrodes into contact with the outer peripheral face of the press-fitting portion 112a of the ring 112 and a contact 139 set to the pallet 138 and applying a voltage therebetween, the vibrating arm portions 105 and 106 of the piezoelectric vibrating piece 102 are vibrated. Further, by measuring the frequency of the vibrating arm portions 105 and 106 while evaporating a metal film forming the finely adjusting portion 110 by irradiating a laser beam to the finely adjusting portion 110, fine adjustment is carried out such that vibration of the vibrating arm portions 105 and 106 of the piezoelectric vibrating piece 102 constitutes the predetermined resonance frequency.

Figure 42:
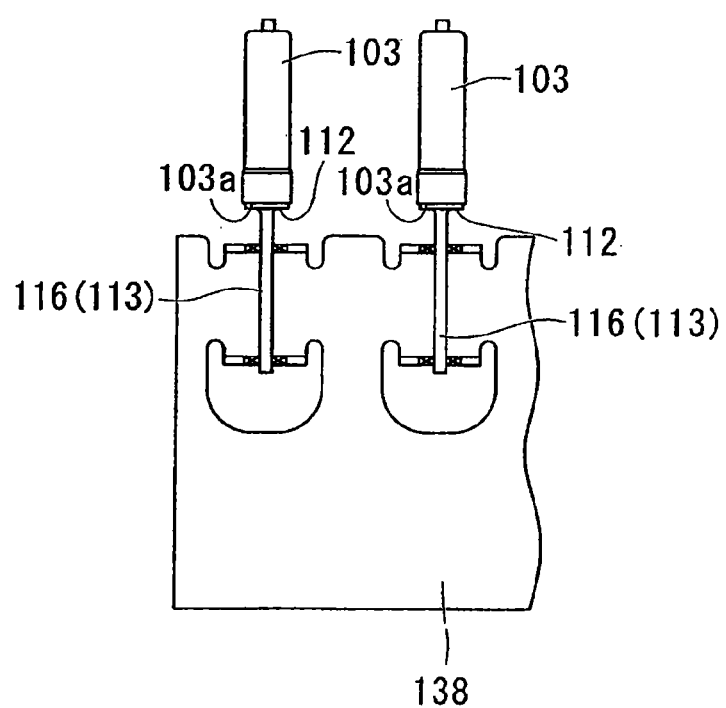
FIG. 42 is an explanatory view showing a press-fitting step in steps of fabricating the piezoelectric vibrator according to the second embodiment of the invention.
Figure 43:
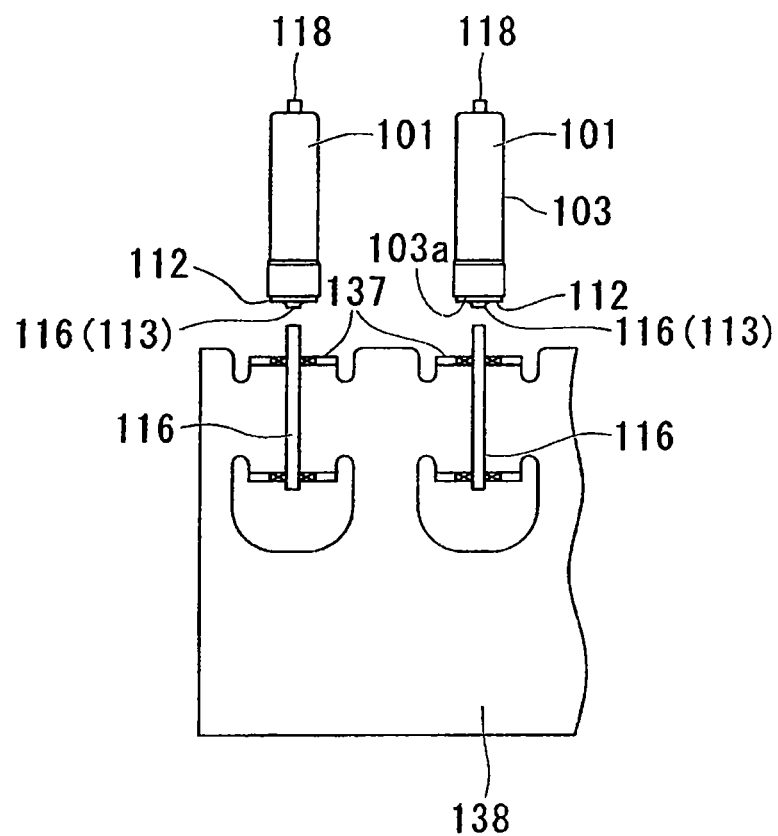
FIG. 43 is an explanatory view showing a cut separating step in steps of fabricating the piezoelectric vibrator according to the second embodiment of the invention.

Next, as a press-fitting step S134, as shown by FIG. 42, in a vacuum atmosphere, by inserting each piezoelectric vibrating piece 102 from the opening portion 103a of the case 103 previously formed by a predetermined shape and press-fitting the ring 112 of the airtight terminal 104 to the case 103, the piezoelectric vibrating piece 102 is brought into a state of being sealed in airtight at inside of the case 103. Finally, as a cut separating step S135, as shown by FIG. 43, by cutting to separate a portion of the first outer lead portion 116 of the lead 113 fitted to an airtight terminal arranging portion 137 of the pallet 138, the piezoelectric vibrator 101 is finished.

As described above, according to the piezoelectric vibrator 101 of the embodiment, with regard to the first exciting electrode 108 and the second exciting electrode 109 of the piezoelectric vibrating piece 102 arranged at inside of the case 103, the first exciting electrode 108 can be conducted from outside by the first outer lead portion 116 of the lead 113 and the second exciting electrode 109 can be conducted from outside by the second outer lead portion 118 of the case 103 by way of the ring 112 and the case 103 without being shortcircuited to each other. Here, the second exciting electrode 109 and the step portion 112e formed at the diameter contracted portion 112b can be connected by arranging the wire 117 by utilizing the gap 112d formed between an inner peripheral face of the case 103 and the step portion 112e of the ring 112 and outer diameters of the case 103 and the ring 112 are not enlarged.

Further, the ring 112 can easily be formed by pressing even when an outer diameter thereof is reduced since the ring 112 is constituted by a simple structure having the press-fitting portion 112a, the diameter contracted portion 112b, and the step portions 112e and 112f. Therefore, according to the piezoelectric vibrator 101 of the embodiment, small-sized formation can be achieved by preventing shortcircuit and the piezoelectric vibrator 101 can be fabricated easily and with excellent yield. Further, the piezoelectric vibrating piece 102 can be arranged at the position substantially equal to the center axis L103 of the case 103 along with the lead 113 by being arranged at the position substantially equal to the center axis of the lead 113 by the bump connecting portion 115a formed substantially by the flat face. Therefore, the inner peripheral face of the case 103 and the piezoelectric vibrating piece 102 can be set to be separated by a minimum size in accordance with a range of displacing the piezoelectric vibrating piece 102, and therefore, small-sized formation of the case 103 and the ring 112 can further be achieved.

Third Embodiment

Figure 44:
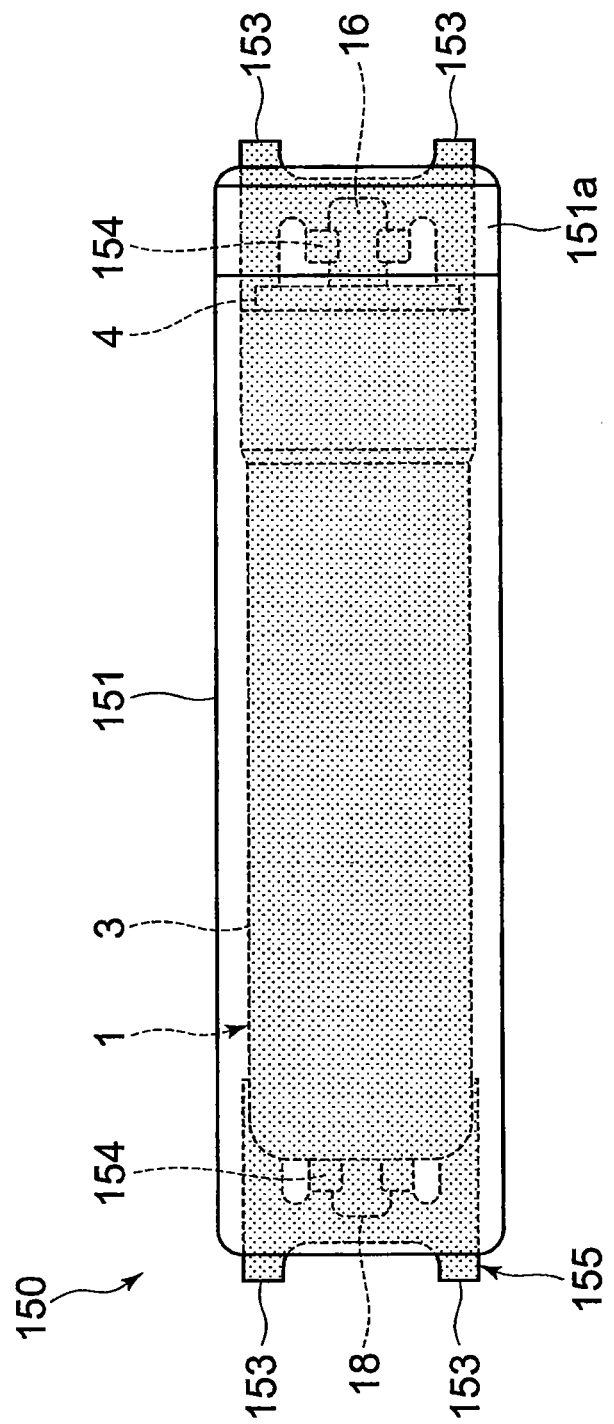
FIG. 44 is a top view of a piezoelectric vibrator according to a third embodiment of the invention.
Figure 45:
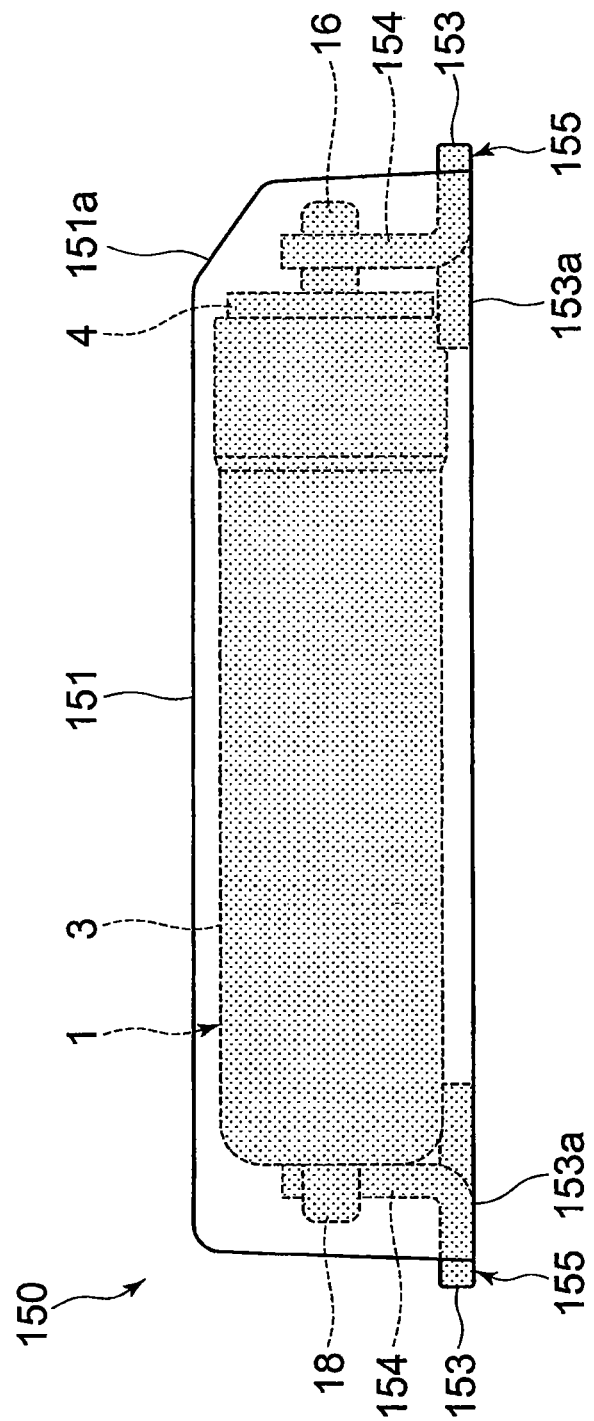
FIG. 45 is a side view of the piezoelectric vibrator according to the third embodiment of the invention.
Figure 46:
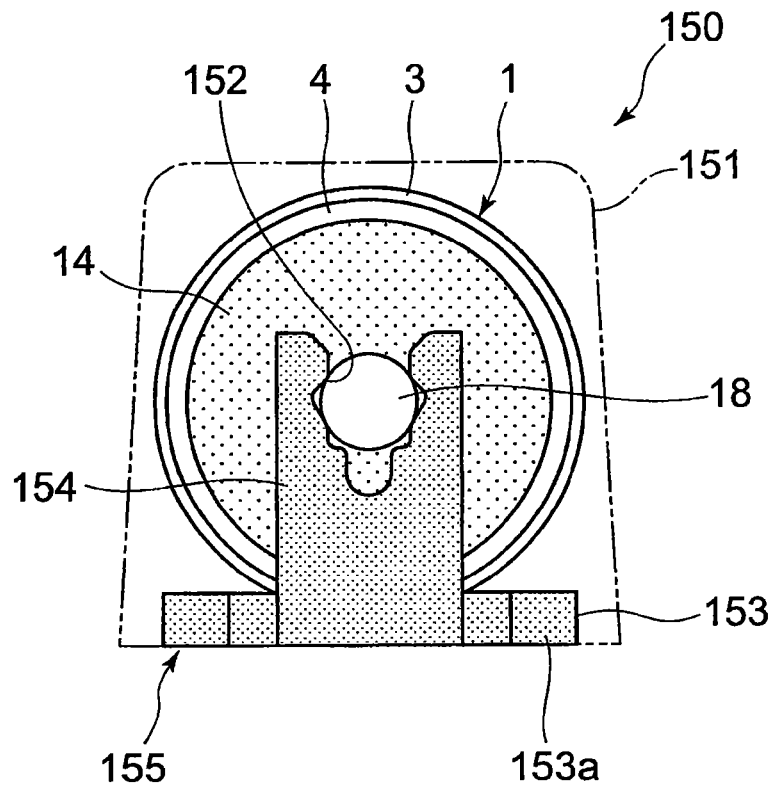
FIG. 46 is a front view of the piezoelectric vibrator according to the third embodiment of the invention.

FIG. 44 through FIG. 46 show a third embodiment according to the invention. In the embodiment, members common to members used in the above-described embodiments are attached with the same notations and an explanation thereof will be omitted.

As shown by FIG. 44 through FIG. 46, a piezoelectric vibrator 150 of the embodiment is a surface mounting type piezoelectric vibrator constituted by molding the piezoelectric vibrator 1 of the first embodiment by a resin. Further in details, the piezoelectric vibrator 150 includes a package 151 constituting a resin member covering the case 3, the first outer lead portion 16 and the second outer lead portion 18, and a pair of external connection terminals 155 which include fitting grooves 152 fitted with the first outer lead portion 16 and the second outer lead portion 18 by elastically widening widths thereof and at least portions of which is exposed from the package 151 to be able to be conducted from outside.

The external connection terminal 155 is a member constituted by folding to form a plate-like metal elastically deformable and having a conductivity, including an external connecting portion 153 in which one face 153a constituting a connecting face is exposed from the package 151 to outside, and a fitting portion 154 having the fitting groove 152 in a V-like shape fitted with the first outer lead portion 16 or the second outer lead portion 18. Further, the first outer lead portion 16 is fitted to the fitting portion 154 of the external connection terminal 155 on one side, and the second outer lead portion 18 is fitted to the fitting portion 154 of the external connection terminal 155 on other side.

As shown by FIG. 46, the fitting groove 152 in the V-like shape is formed by an "angle-like" shape on one side thereof, is temporarily widened elastically and thereafter recovered to an original state when the first outer lead portion 16 or the second outer lead portion 18 is pressed thereto, and pinches to fix the first outer lead portion 16 or the second outer lead portion 18 while being brought into contact therewith at 4 points.

Further, an outer surface of the external connection terminal 155 is formed with a plating layer, not illustrated. Therefore, a conductivity with the first outer lead portion 16 and the second outer lead portion 18 can be promoted, and the first outer lead portion 16 and the second outer lead portion 18 and the fitting portions 154 can be fixedly attached to each other by way of the plating layers. Therefore, both electric connection and mechanical connection can further be ensured. Further, also a conductivity between the outer connection terminal 155 and outside can further be ensured.

Further, the package 151 is molded substantially by a shape of a parallelepiped as a whole. In this case, an outer face of the package 151 on a side of the first outer lead portion 16 is formed with a chamfering portion 151a as shown by FIGS. 44 and 45. Therefore, even when the piezoelectric vibrator 1 is molded by the package 151, positions of the first outer lead portion 16 and the second outer lead portion 18 can accurately be confirmed by constituting an index by the chamfering portion 151a. Therefore, mounting can be carried out without mistaking directions.

In this way, even the piezoelectric vibrator 150 can be downsized without shortcircuiting the exciting electrodes, not illustrated, provided at the both faces of the quartz piece 2a and can easily be fabricated, and, for example, as an outer shape of the package 151, a size of a section having a side equal to or smaller than 1.1 mm and a length equal to or smaller than 4.3 mm can be realized. Therefore, the piezoelectric vibrator 150 can be mounted on a board by a smaller space and space saving formation on the board can be achieved.

Particularly, the fitting groove 152 of the external connection terminal 155 can elastically be widened, and therefore, the first outer lead portion 16 and the second outer lead portion 18 can be fitted to the fitting groove 152 only by being pressed thereto. Therefore, even when downsizing is carried out as a whole, the first outer lead portion 16 and the second outer lead portion 18 and the external connection terminals 155 can easily be connected.

Further, although according to the embodiment, an explanation has been given by taking an example of the case of molding the piezoelectric vibrator 1 of the first embodiment by a resin, the piezoelectric vibrator 101 of the second embodiment may be molded by a resin. Also in this case, similar operation and effect can be achieved.

Fourth Embodiment

Figure 47:
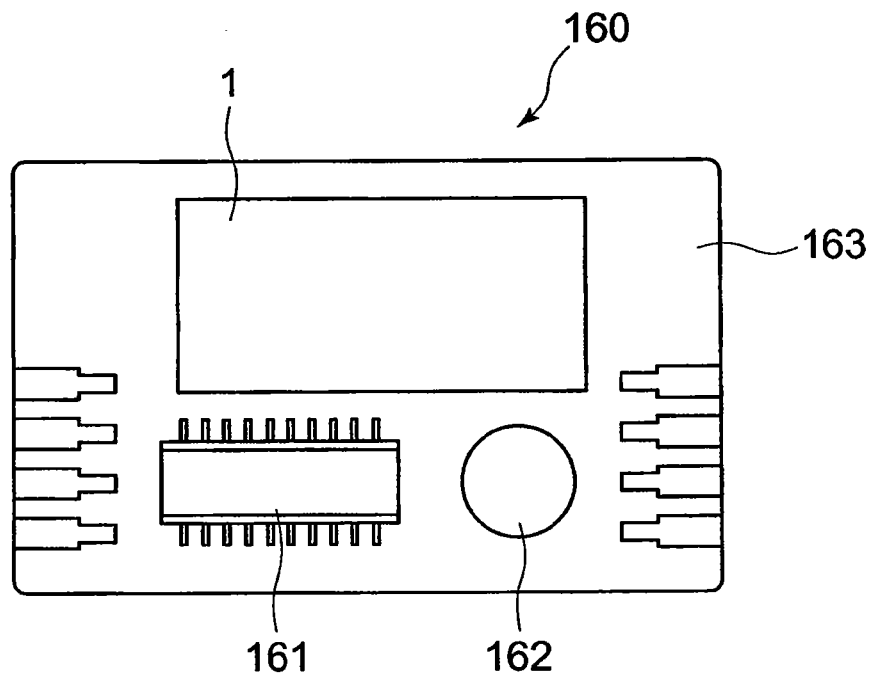
FIG. 47 is an outline view of an oscillator according to a fourth embodiment of the invention.

FIG. 47 shows a fourth embodiment according to the invention. In the embodiment, members common to members used in the above-described embodiments are attached with the same notations and an explanation thereof will be omitted.

FIG. 47 is an outline view showing a constitution of a tuning fork type quartz oscillator according to the invention, showing a plane view of a surface mounting type piezoelectric oscillator utilizing the above-described piezoelectric vibrator. As shown by FIG. 47, according to an oscillator 160, the cylinder package type piezoelectric vibrator 1 is constituted as an oscillator electrically connected to an integrated circuit 161. Further, the piezoelectric vibrator 1 is similar to that of the first embodiment, and therefore, an explanation thereof will be omitted.

The oscillator 160 includes a board 163 mounted with an electronic part 162 of a capacitor or the like. The board 163 is mounted with the integrated circuit 161 for the oscillator and the piezoelectric vibrator 1 is mounted to a vicinity of the integrated circuit 161. The electronic part 162, the integrated circuit 161 and the piezoelectric vibrator 1 are electrically connected respectively by a wiring pattern, not illustrated. Further, respective constituent parts are molded by a resin, not illustrated.

According to the oscillator 160 constituted in this way, when a voltage is applied to the piezoelectric vibrator 1, the piezoelectric vibrating piece 2 at inside of the piezoelectric vibrator 1 is vibrated, the vibration is converted into an electric signal by a piezoelectric property of quartz and is inputted to the integrated circuit 161 as an electric signal. The inputted electric signal is variously processed by the integrated circuit 161 and is outputted as a frequency signal. Thereby, the piezoelectric vibrator 1 functions as the oscillator. Further, by selectively setting a constitution of the integrated circuit 161, for example, RTC (Real Time Clock) module or the like in accordance with a request, other than a single function of an oscillator for a time piece, functions of controlling operation date and time of the apparatus or an external apparatus, or providing time, calendar or the like can be added.

As described above, according to the oscillator 160 of the embodiment, a small-sized and highly reliable oscillator can be provided by providing the piezoelectric vibrator 1 which is small-sized and in which there is not a concern of shortcircuit as descried above.

Further, although an explanation has been given such that the oscillator 160 includes the cylinder package type piezoelectric vibrator 1, the invention is not limited thereto but, for example, the cylinder package type piezoelectric vibrator 101 shown in the second embodiment will do, and the surface mounting type package type piezoelectric vibrator 150 shown in the third embodiment will do.

Fifth Embodiment

Figure 48:
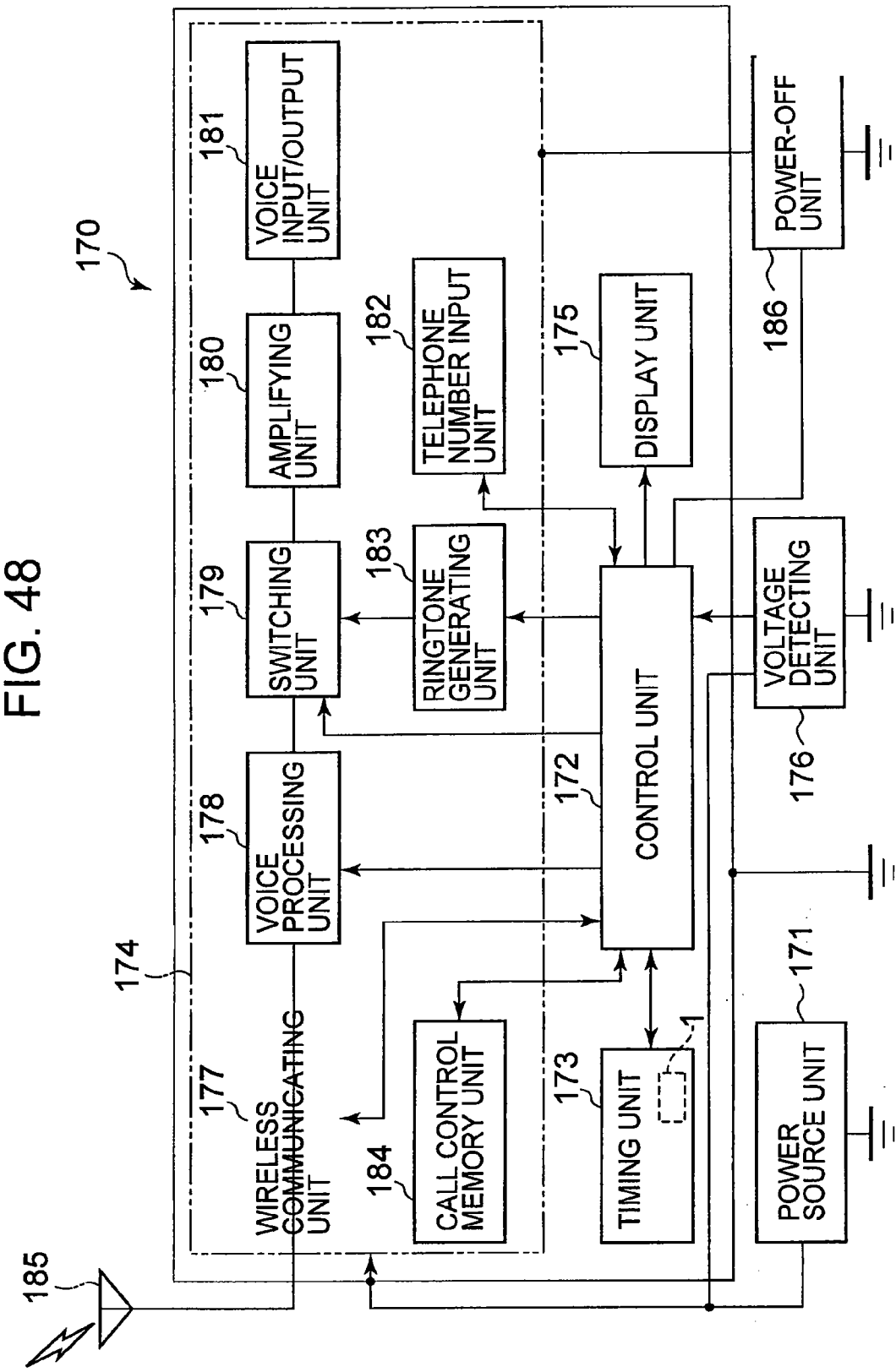
FIG. 48 is a block diagram of an electronic apparatus according to a fifth embodiment of the invention.

FIG. 48 shows a fifth embodiment according to the invention. In the embodiment, members common to members used in the above-described embodiments are attached with the same notations and an explanation thereof will be omitted.

In the embodiment, an explanation will be given by taking an example of a portable information apparatus having the above-described piezoelectric vibrator 1 as an electronic apparatus. FIG. 48 is a block diagram showing a constitution of the electronic apparatus. As shown by FIG. 48, a portable information apparatus 170 of the embodiment includes the piezoelectric vibrator 1, and a power source portion 171 for supplying power. The power source portion 171 is constituted with a lithium secondary battery, for example. The power source portion 171 is connected in parallel with a control portion 172 for carrying out various controls, a counting portion 173 performing count of time or the like, a communication portion 174 for carrying out communications with outside, a display portion 175 for displaying various kinds of information, and a voltage detection portion 176 for detecting voltages of respective function portions. Further, power is supplied to the respective function portions by the power source portion 171.

The control portion 172 carries out a control of operation of a total of a system of transmission and reception of voice data, measurement or display of current time and the like by controlling the respective function portions. Further, the control portion 172 includes ROM previously written with a program, CPU for reading and executing the program written to ROM, RAM used as a work area of CPU and the like.

The counting portion 173 includes an integrated circuit including an oscillating circuit, a register circuit, a counter circuit and an interface circuit or the like, and the piezoelectric vibrator 1. When a voltage is applied to the piezoelectric vibrator 1, the piezoelectric vibrating piece 2 is vibrated, the vibration is converted into an electric signal by a piezoelectric property provided to quartz and is inputted to the oscillating circuit as the electric signal. An output of the oscillating circuit is binalized and is counted by the register circuit and the counter circuit. Further, transmission and reception of a signal is carried out with the control portion 172 by way of the interface circuit and the display portion 175 is displayed with time or current date or calendar information and the like.

The communication portion 174 is provided with a function similar to that of a portable telephone of the related art and includes a wireless portion 177, a voice processing portion 178, a switching portion 179, an amplifying portion 180, a voice input/output portion 181, a telephone number input portion 182, an incoming sound generating portion 183, and a call control memory portion 184. The wireless portion 177 exchanges to transmit and receive various data of the voice data or the like to and from a base station by way of an antenna 185. The voice processing portion 178 codes and decodes a voice signal inputted from the wireless portion 177 or the amplifying portion 180. The amplifying portion 180 amplifies a signal inputted from the voice processing portion 178 or the voice input/output portion 181 to a predetermined level. The voice input/output portion 181 is constituted by a speaker, a microphone and the like for making incoming sound or speech sound loud or collecting sound.

Further, the incoming sound generating portion 183 generates incoming sound in accordance with a call from a base station. The switching portion 179 switches the amplifying portion 180 connected to the voice processing portion 178 to the incoming sound generating portion 183 only in receiving to thereby output incoming sound generated by the incoming sound generating portion 183 to the voice input/output portion 181 by way of the amplifying portion 180. Further, the call control memory portion 184 is stored with a program related to an outgoing/incoming call control of communication. Further, the telephone number input portion 182 includes, for example, number keys 0 through 9 and other key and by depressing the number key or the like, a telephone number or the like of a counter party of speech is inputted.

When the voltage applied to the respective function portions of the control portions 172 and the like by the power source portion 171 becomes lower than a predetermined value, the voltage detection portion 176 detects the voltage drop to inform to the control portion 172. The predetermined voltage value at this occasion is a value previously set as a necessary minimum voltage for operating the communication portion 174 stably and is, for example, about 3 V. The control portion 172 informed of the voltage drop from the voltage detection portion 176 prohibits operation of the wireless portion 177, the voice processing portion 178, the switching portion 179 and the incoming sound generating portion 183. Particularly, it is indispensable to stop operating the wireless portion 177 having large power consumption. Further, the display portion 175 displays that the communication portion 174 is unable to be used by a deficiency in a remaining amount of a battery.

That is, by the voltage detection portion 176 and the control portion 172, the operation of the communication portion 174 is prohibited and the prohibition can be displayed on the display portion 175. Although the display may be constituted by a character message, as a further intuitive display, a telephone icon displayed at an upper portion of a display face of the display portion 175 may be attached with x (check) mark. Further, the portable information apparatus 170 is provided with a power source shut off portion 186 capable of selectively shutting off a power source of a portion related to the communication portion 174 and the function of the communication portion 174 can firmly be stopped by the power source shut off portion 186.

According to the portable information apparatus 170 of the embodiment, a small-sized and highly reliable portable information apparatus can be provided by providing the piezoelectric vibrator 1 which is small-sized and in which there is not a concern of shortcircuit as described above.

Further, although an explanation has been given such that the portable information apparatus 170 includes the cylinder package type piezoelectric vibrator 1, the invention is not limited thereto, but, for example, the cylinder package type piezoelectric vibrator 101 shown in the second embodiment will do and the surface mounting type package type piezoelectric vibrator 150 shown in the third embodiment will do. When the piezoelectric vibrator 150 is mounted, the piezoelectric vibrator 150 can be connected onto a printed board by reflow soldering simultaneously with other electronic apparatus, mounting is further preferable.

Sixth Embodiment

Figure 49:
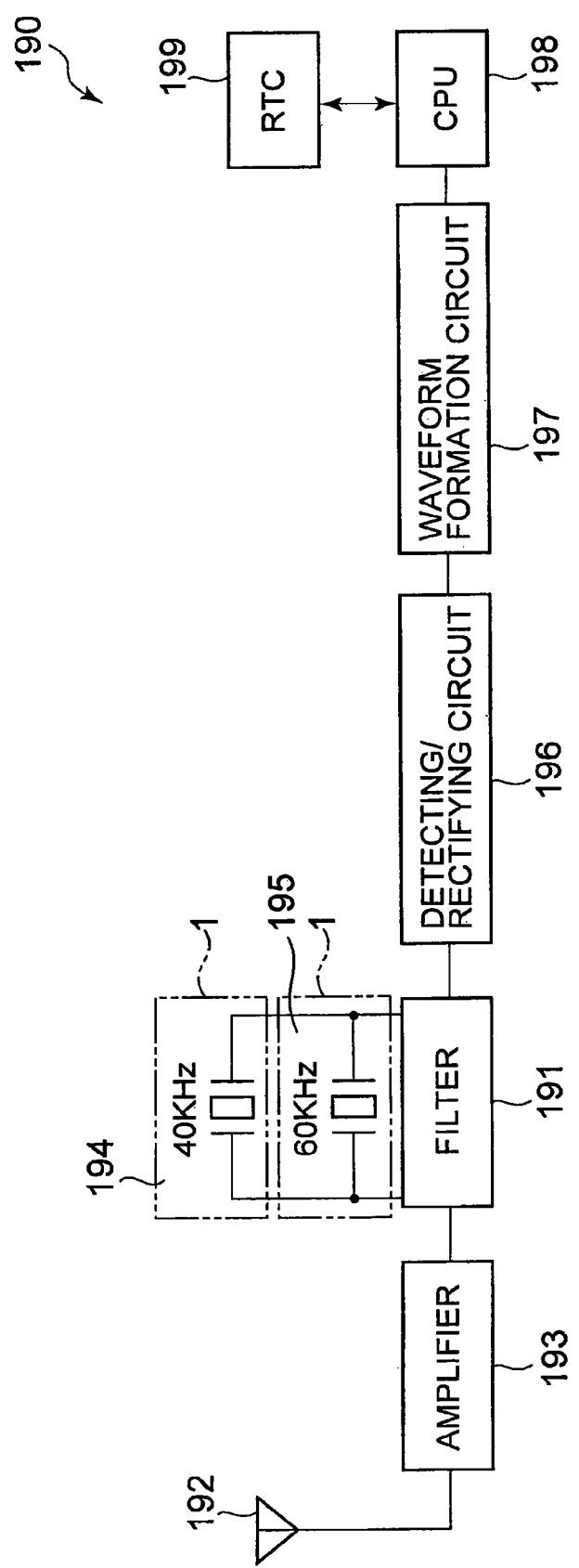
FIG. 49 is a block diagram of a radio wave timepiece according to a sixth embodiment of the invention.

FIG. 49 shows a sixth embodiment according to the invention. In the embodiment, members common to members used in the above-described embodiments are attached with the same notations and an explanation thereof will be omitted.

In the embodiment, as one embodiment of a radio wave time piece, a radio wave timepiece having the above-described piezoelectric vibrator 1 will be explained. FIG. 49 is a block diagram showing a constitution of the radio wave timepiece. As shown by FIG. 49, a radio wave timepiece 190 of the embodiment is a timepiece including the piezoelectric vibrator 1 electrically connected to a filter portion 191 having a function of receiving a standard radio wave including timepiece information and automatically correcting the timepiece to accurate time to display. In Japan, there are transmitters (transmitting stations) for transmitting standard radio wave at Fukushima prefecture (40 kHz) and Saga prefecture (60 kHz) for respectively transmitting standard radio waves. A long wave of 40 kHz or 60 kHz is provided with both of a property of propagating on the ground surface and a property of propagating while being reflected by the an ionized layer and the ground surface, and therefore, a propagating range is wide and all of Japan is covered by two transmitters.

An antenna 192 receives the standard radio wave of the long wave of 40 kHz or 60 kHz. The standard radio wave or the long wave is constituted by subjecting the time information referred to as a time code to AM modulation to a carrier wave of 40 kHz or 60 kHz. The received standard radio wave of the long wave is amplified by an amplifier 193 and filtered and tuned by the filter portion 191 having a plurality of the piezoelectric vibrators 1. Further, the piezoelectric vibrator 1 is respectively provided with piezoelectric vibrator portions 194 and 195 having resonance frequencies of 40 kHz and 60 kHz the same as frequencies of the carrier waves.

Further, the filtered signal of the predetermined frequency is detected and decoded by a detecting/rectifying circuit 196. Further, the time code is outputted by way of a waveform shaping circuit 197 and is counted by CPU 198. CPU 198 read information of current year, accumulated date, day/date, time or the like. The read information is reflected to RTC 199 and accurate time information is displayed. The carrier wave is constituted by 40 kHz or 60 kHz, and therefore, the piezoelectric vibrator having the tuning fork structure is preferable for the piezoelectric vibrator portion 194 or 195. When an example is taken by 60 kHz, as an example of a dimension of the tuning fork type vibrating piece, the vibrating piece can be constituted by a dimension of a total length of about 2.8 mm, a width dimension of the base portion of about 0.5 mm.

According to the radio wave timepiece 190 of the embodiment, by providing the piezoelectric vibrator 1 which is small-sized and in which there is not a concern of shortcircuit as described above, a small-sized and highly reliable radio wave timepiece can be provided.

Further, although an explanation has been given such that the radio wave timepiece 190 is provided with the cylinder package type piezoelectric vibrator 1, the invention is not limited thereto but, for example, the cylinder package type piezoelectric vibrator 101 shown in the second embodiment will do and the surface mounting type package type piezoelectric vibrator 150 shown in the third embodiment will do.

Although a detailed description has been given of the embodiments of the invention as descried above in reference to the drawings, a mode of vibration is not limited to flexing vibration constituting fork type but a vibrating piece of other vibration mode of thickness sliding vibration mode or the like will do. Further, the piezoelectric material is not limited to quartz but a piezoelectric material of lithium niobate, lithium tantalate, langasite or the like will do. Further, the specific constitution is not limited to the embodiments but also includes a design change or the like in the range not deviated from the gist of the invention.

What is claimed is:

1. A method of fabricating a piezoelectric vibrator which is a method of fabricating a piezoelectric vibrator in which a piezoelectric vibrating piece substantially constituted by a shape of a plate and including exciting electrodes respectively at both faces thereof at inside of a case constituted by a shape of a bottomed cylinder an opening portion of which is sealed in airtight, the method comprising:

a filling member transferring step of inserting a filling member formed with a through hole and having an insulating property to an inside of a ring substantially constituted by a shape of a cylinder having a conductivity;

a lead transferring step of inserting one piece of a lead to the through hole of the filling member inserted to inside of the ring to project from both sides of the ring;

a filling member sintering step of sintering the filling member along with the ring and the lead to integrate in an airtight manner;

a first mounting step of subjecting one of the exciting electrodes of the piezoelectric vibrating piece to a bump connection with an inner lead portion of the lead projected from the ring;

a second mounting step of subjecting other of the exciting electrodes, on a side opposed to the one of the exciting electrodes of the piezoelectric vibrating piece connected to the inner lead portion, to wire bonding with the ring; and a press-fitting step of press-fitting the ring to an opening portion of the case having a conductivity and sealing the piezoelectric vibrating piece connected with the inner lead portion to inside of the case in an airtight manner.

2. The method of fabricating a piezoelectric vibrator according to claim 1, further comprising:

a bump connecting portion forming step of forming a bump connecting portion substantially constituted by a flat face by pressing to crush a portion of the inner lead portion of the lead;

wherein in the first mounting step, the one of the exciting electrodes of the piezoelectric vibrating piece is subjected to bump connection with the bump connecting portion.

3. The method of fabricating a piezoelectric vibrator according to claim 2;

wherein the bump connecting portion forming step is carried out after the filling member sintering step.

4. The method of fabricating a piezoelectric vibrator according to claim 1, further comprising:

a ring forming step of forming the ring substantially by a shape of a cylinder and forming a wire connecting portion, projected to an inner peripheral side at an end portion of the ring, by pressing a plate member having a conductivity;

wherein in the second mounting step, the wire bonding is carried out to the wire connecting portion of the ring.

5. The method of fabricating a piezoelectric vibrator according to claim 4;

wherein in the ring forming step, as the wire connecting portion, an inner flange is formed by projecting the end portion of the ring to an inner peripheral side over an entire periphery thereof by pressing.

6. The method of fabricating a piezoelectric vibrator according to claim 1;

wherein in the second mounting step, the other of the exciting electrodes of the piezoelectric vibrating piece and the ring are subjected to wire bonding by a plurality of wires.

7. A method of fabricating a piezoelectric vibrator which is a method of fabricating a piezoelectric vibrator arranged with a piezoelectric vibrating piece substantially constituted by a shape of a plate and having exciting electrodes respectively at both faces thereof at inside of a case constituted by a shape of a bottomed cylinder an opening portion of which is sealed in airtight by press-fitting a ring filled with a filling member at inside thereof, the method comprising:

a ring forming step of forming the ring by a shape including a press-fitting portion press-fitted to the case and a diameter contracted portion contracted and extended from the press-fitting portion by pressing a plate member having a conductivity;

a filling member transferring step of inserting the filling member having an insulating property formed with a through hole to an inside of the ring formed with the diameter contracted portion;

a lead transferring step of inserting one piece of the lead to the through hole of the filling member inserted to inside of the ring to project from both sides of the ring;

a filling member sintering step of sintering the filling member along with the ring and the lead to integrate in an airtight manner;

a first mounting step of subjecting one of the exciting electrodes of the piezoelectric vibrating piece to bump, connection with the inner lead portion of the lead projected from a side of the diameter contracted portion of the ring;

a second mounting step of subjecting other of the exciting electrodes, on a side opposed to the one of the exciting electrodes of the piezoelectric vibrating piece connected to the inner lead portion, to wire bonding with an outer peripheral face of the diameter contracted portion of the ring; and a press-fitting step of press-fitting the ring to an opening portion of the case and sealing the piezoelectric vibrating piece connected to the inner lead portion to inside of the case in an airtight manner.

8. The method of fabricating a piezoelectric vibrator according to claim 7;

wherein in the ring forming step, the press-fitting portion and the diameter contracted portion are formed and a step portion substantially constituted by a flat face, is formed at a portion of the outer peripheral face of the diameter contracted portion; and wherein in the second mounting step, the wire bonding is carried out at the step portion of the ring.

9. The method of fabricating a piezoelectric vibrator according to claim 7;

wherein the ring forming step, the plate member is formed substantially symmetrically with each other relative to a center axis of the ring; and wherein in the second mounting step, the wire bonding is carried out with either one of the step portions of the ring.

10. The method of fabricating a piezoelectric vibrator according to claim 7;

wherein in the second mounting step, the other of the exciting electrodes of the piezoelectric vibrating piece and the diameter contracted portion of the ring are subjected to wire bonding by a plurality of wires.

11. The method of fabricating a piezoelectric vibrator according to claim 7, further comprising:

a bump connecting portion forming step of forming a bump connecting portion substantially constituted by a flat face by pressing to crush a portion of the inner lead portion of the lead;

wherein in the first mounting step, one of the exciting electrodes of the piezoelectric vibrating piece is subjected to bump connection with the bump connecting portion.

12. The method of fabricating a piezoelectric vibrator according to claim 11;

wherein the bump connecting portion forming step is carried out after the filling member sintering step.

* * * * *